US012563735B2

(12) United States Patent

Bicksler

(10) Patent No.: US 12,563,735 B2

(45) Date of Patent: Feb. 24, 2026

(54) ELECTRONIC DEVICES INCLUDING VERTICAL STRINGS OF MEMORY CELLS, AND RELATED MEMORY DEVICES, SYSTEMS AND METHODS

(71) Applicant: Micron Technology, Inc., Boise, ID (US)

(72) Inventor: Andrew Bicksler, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 484 days.

(21) Appl. No.: 17/446,649

(22) Filed: Sep. 1, 2021

(65) Prior Publication Data

US 2023/0066753 A1      Mar. 2, 2023

(51) Int. Cl.
| | |
|---|---|
| *H10B 43/35* | (2023.01) |
| *H10B 41/27* | (2023.01) |
| *H10B 41/35* | (2023.01) |
| *H10B 41/41* | (2023.01) |
| *H10B 43/27* | (2023.01) |
| *H10B 43/40* | (2023.01) |

(52) U.S. Cl.
CPC ............. *H10B 43/35* (2023.02); *H10B 41/27* (2023.02); *H10B 41/35* (2023.02); *H10B 41/41* (2023.02); *H10B 43/27* (2023.02); *H10B 43/40* (2023.02)

(58) Field of Classification Search
CPC ........ H10B 43/27; H10B 43/35; H10B 43/40; H10B 43/20; H10B 43/10; H10B 43/30; H10B 41/27; H10B 41/35; H10B 41/10; H10B 41/41; H10B 41/40
See application file for complete search history.

(56) References Cited

U.S. PATENT DOCUMENTS

| | | | | |
|---|---|---|---|---|
| 4,686,758 A | * | 8/1987 | Liu | ...................... H01L 21/8221 438/153 |
| 6,316,357 B1 | * | 11/2001 | Lin | ...................... H01L 29/4933 438/662 |
| 6,700,154 B1 | * | 3/2004 | Vidmantas | ............. H10B 41/30 257/317 |
| 6,828,623 B1 | * | 12/2004 | Guo | .................. H01L 29/40114 438/257 |
| 7,626,230 B2 | * | 12/2009 | Joo | ......................... H10B 69/00 257/334 |
| 7,723,774 B2 | * | 5/2010 | Chen | .................. H01L 29/7887 257/315 |
| 7,956,408 B2 | * | 6/2011 | Enda | ...................... H10B 69/00 257/326 |
| 8,072,812 B2 | | 12/2011 | Roohparvar et al. | |
| 8,178,861 B2 | * | 5/2012 | Futatsuyama | .......... H10B 41/40 257/E23.164 |
| 8,310,875 B2 | * | 11/2012 | Sakurai | .................. H10B 43/35 365/185.11 |
| 8,355,283 B2 | | 1/2013 | Roohparvar et al. | |

(Continued)

*Primary Examiner* — Sophia T Nguyen

(74) *Attorney, Agent, or Firm* — TraskBritt

(57)      ABSTRACT

An electronic device comprises a stack comprising tiers of alternating conductive structures and insulative structures overlying a source tier, a pillar comprising a channel material extending vertically through the stack, and a sense device comprising a gate material within the source tier. The gate material of the sense devices is in electrical communication with the channel material of the pillar. Related memory devices, systems, and methods are also described.

18 Claims, 9 Drawing Sheets

(56) References Cited

U.S. PATENT DOCUMENTS

| | | | | |
|---|---|---|---|---|
| 8,426,301 | B2* | 4/2013 | Oh | H10D 88/00 |
| | | | | 438/587 |
| 8,687,430 | B2 | 4/2014 | Sarin et al. | |
| 8,754,485 | B2* | 6/2014 | Lee | H10B 43/27 |
| | | | | 257/390 |
| 8,963,156 | B2* | 2/2015 | Zhu | H10B 69/00 |
| | | | | 257/365 |
| 9,123,420 | B2 | 9/2015 | Rabkin et al. | |
| 9,209,199 | B2* | 12/2015 | Simsek-Ege | H10B 43/35 |
| 9,275,909 | B2* | 3/2016 | Jayanti | H10B 43/27 |
| 9,478,495 | B1* | 10/2016 | Pachamuthu | H01L 21/324 |
| 9,536,970 | B2* | 1/2017 | Seol | H01L 21/32137 |
| 9,559,114 | B2* | 1/2017 | Lee | H10B 43/27 |
| 9,741,737 | B1* | 8/2017 | Huang | H10B 43/35 |
| 9,824,966 | B1* | 11/2017 | Kanakamedala | H01L 23/5226 |
| 9,893,076 | B2 | 2/2018 | Rhie | |
| 9,941,293 | B1* | 4/2018 | Pang | H10B 43/35 |
| 10,020,314 | B1* | 7/2018 | Baraskar | H10B 41/10 |
| 10,038,005 | B1 | 7/2018 | Zhang et al. | |
| 10,381,363 | B2* | 8/2019 | Simsek-Ege | H10B 41/41 |
| 10,535,405 | B2* | 1/2020 | Lee | G11C 16/16 |
| 10,770,470 | B2* | 9/2020 | Tanzawa | H10B 43/40 |
| 10,784,273 | B2* | 9/2020 | Howder | H10B 41/60 |
| 10,811,431 | B1* | 10/2020 | Makala | H10B 51/20 |
| 10,910,399 | B2* | 2/2021 | Lue | H10B 43/10 |
| 10,923,493 | B2* | 2/2021 | Fayrushin | H01L 23/528 |
| 10,937,501 | B2 | 3/2021 | Yamada | |
| 11,088,165 | B2* | 8/2021 | Haller | H01L 21/76831 |
| 11,495,303 | B2* | 11/2022 | Umezawa | G11C 16/24 |
| 11,727,995 | B2* | 8/2023 | Nakazawa | H01L 23/481 |
| | | | | 365/189.011 |
| 11,770,930 | B2* | 9/2023 | Luo | H10B 43/27 |
| | | | | 257/314 |
| 11,778,824 | B2* | 10/2023 | Fayrushin | H01L 21/76877 |
| | | | | 257/324 |
| 11,925,024 | B2* | 3/2024 | Kubota | H01L 23/528 |
| 11,978,508 | B2* | 5/2024 | Yanagidaira | G11C 11/5642 |
| 12,230,325 | B2* | 2/2025 | Scarbrough | H10B 43/27 |
| 12,400,686 | B2* | 8/2025 | Fukuzumi | H10B 43/10 |
| 2001/0042883 | A1* | 11/2001 | Li | H01L 29/7883 |
| | | | | 257/315 |
| 2002/0024081 | A1* | 2/2002 | Gratz | H10B 41/35 |
| | | | | 257/E21.651 |
| 2003/0001159 | A1* | 1/2003 | Ohtani | H01L 27/1277 |
| | | | | 257/E29.294 |
| 2003/0098479 | A1* | 5/2003 | Murthy | H01L 29/1083 |
| | | | | 257/E29.054 |
| 2004/0007724 | A1* | 1/2004 | Murthy | H01L 29/66772 |
| | | | | 438/300 |
| 2004/0165462 | A1* | 8/2004 | Morgan | G11C 7/065 |
| | | | | 365/205 |
| 2005/0079721 | A1* | 4/2005 | Buerger, Jr. | H01L 27/105 |
| | | | | 257/E27.005 |
| 2007/0252201 | A1* | 11/2007 | Kito | H10B 43/20 |
| | | | | 257/E21.679 |
| 2008/0173933 | A1* | 7/2008 | Fukuzumi | H01L 29/7881 |
| | | | | 257/E29.302 |
| 2008/0179659 | A1* | 7/2008 | Enda | H10B 43/30 |
| | | | | 257/326 |
| 2010/0090188 | A1* | 4/2010 | Futatsuyama | H10B 43/27 |
| | | | | 257/E45.002 |
| 2010/0118610 | A1* | 5/2010 | Katsumata | H10B 43/27 |
| | | | | 257/319 |
| 2011/0062510 | A1* | 3/2011 | Joo | H01L 29/7926 |
| | | | | 257/E21.409 |
| 2011/0090737 | A1* | 4/2011 | Yoo | H10B 41/40 |
| | | | | 365/185.11 |
| 2011/0092033 | A1* | 4/2011 | Arai | H01L 29/792 |
| | | | | 257/E21.536 |
| 2011/0256308 | A1* | 10/2011 | Buerger, Jr. | H01L 21/0337 |
| | | | | 427/97.3 |
| 2012/0146122 | A1* | 6/2012 | Whang | H10B 43/30 |
| | | | | 257/315 |
| 2012/0181596 | A1* | 7/2012 | Liu | H10B 41/27 |
| | | | | 257/E21.422 |
| 2012/0211823 | A1* | 8/2012 | Lim | H10B 43/10 |
| | | | | 257/326 |
| 2012/0299117 | A1* | 11/2012 | Lee | H10B 43/27 |
| | | | | 257/E27.06 |
| 2013/0069097 | A1* | 3/2013 | Mori | H01L 33/58 |
| | | | | 257/98 |
| 2013/0153028 | A1* | 6/2013 | Hayashi | H01L 29/66765 |
| | | | | 136/258 |
| 2013/0215690 | A1* | 8/2013 | Goda | H10D 30/689 |
| | | | | 257/314 |
| 2014/0119117 | A1* | 5/2014 | Sakui | H01L 23/53228 |
| | | | | 365/185.05 |
| 2014/0321188 | A1* | 10/2014 | Tanzawa | G11C 5/06 |
| | | | | 365/63 |
| 2015/0076586 | A1* | 3/2015 | Rabkin | H10B 43/35 |
| | | | | 257/324 |
| 2015/0333001 | A1* | 11/2015 | Sakui | G11C 11/5671 |
| | | | | 257/314 |
| 2015/0348989 | A1* | 12/2015 | Pekny | H10B 43/27 |
| | | | | 257/314 |
| 2016/0056172 | A1* | 2/2016 | Shim | G11C 16/0466 |
| | | | | 257/315 |
| 2016/0141301 | A1 | 5/2016 | Mokhlesi et al. | |
| 2016/0163729 | A1 | 6/2016 | Zhang et al. | |
| 2017/0069731 | A1* | 3/2017 | Kim | H10B 41/41 |
| 2017/0077114 | A1* | 3/2017 | Yoshimori | H01L 23/528 |
| 2017/0084624 | A1 | 3/2017 | Lee et al. | |
| 2017/0117289 | A1* | 4/2017 | Liu | H10B 43/40 |
| 2017/0154895 | A1* | 6/2017 | Huo | H01L 29/40117 |
| 2017/0352679 | A1* | 12/2017 | Chen | H10B 43/27 |
| 2018/0006052 | A1* | 1/2018 | Hwang | H01L 21/76879 |
| 2018/0102375 | A1* | 4/2018 | Pang | H01L 21/0262 |
| 2018/0240814 | A1* | 8/2018 | Fukuzumi | H10D 64/685 |
| 2018/0269210 | A1* | 9/2018 | Tezuka | H10B 43/27 |
| 2018/0286874 | A1* | 10/2018 | Kim | H10B 43/35 |
| 2019/0019558 | A1* | 1/2019 | Lee | H10B 43/10 |
| 2019/0050169 | A1* | 2/2019 | Komai | G11C 7/18 |
| 2019/0304996 | A1* | 10/2019 | Economy | H10B 43/27 |
| 2020/0083245 | A1* | 3/2020 | Fayrushin | H01L 23/528 |
| 2020/0127004 | A1* | 4/2020 | Dorhout | H10B 43/10 |
| 2020/0135242 | A1* | 4/2020 | Arai | G11C 16/24 |
| 2020/0203339 | A1* | 6/2020 | Yamazaki | H10B 43/27 |
| 2020/0212059 | A1* | 7/2020 | Nishikawa | H10B 41/35 |
| 2020/0286910 | A1* | 9/2020 | Kashima | H10B 41/35 |
| 2020/0295024 | A1* | 9/2020 | Takahashi | G11C 16/26 |
| 2020/0295033 | A1* | 9/2020 | Sakamoto | H10B 41/27 |
| 2020/0303402 | A1* | 9/2020 | Kobayashi | H10B 41/35 |
| 2020/0350168 | A1* | 11/2020 | Kim | H01L 21/02532 |
| 2020/0402999 | A1* | 12/2020 | Nakaki | H10B 41/35 |
| 2021/0082948 | A1* | 3/2021 | Kubota | H10B 43/10 |
| 2021/0091009 | A1* | 3/2021 | Datta | H01L 23/5226 |
| 2021/0126009 | A1* | 4/2021 | Luo | H10B 41/35 |
| 2021/0151574 | A1* | 5/2021 | Haller | H01L 21/02129 |
| 2021/0175248 | A1* | 6/2021 | Haller | H01L 21/76805 |
| 2021/0193675 | A1* | 6/2021 | Howder | H10B 43/27 |
| 2021/0217761 | A1* | 7/2021 | Tiwari | H10B 41/27 |
| 2021/0233779 | A1* | 7/2021 | Kang | H01L 23/5226 |
| 2021/0257386 | A1* | 8/2021 | Wang | H10B 41/10 |
| 2021/0288060 | A1* | 9/2021 | Hachisuga | H10B 43/40 |
| 2021/0335418 | A1* | 10/2021 | Yanagidaira | G11C 16/26 |
| 2021/0375903 | A1* | 12/2021 | Hopkins | G11C 5/025 |
| 2022/0085050 | A1* | 3/2022 | Nakaki | H10B 43/35 |
| 2022/0108947 | A1* | 4/2022 | Luo | H01L 23/5226 |
| 2022/0149061 | A1* | 5/2022 | Hopkins | H10B 43/27 |
| 2022/0180937 | A1* | 6/2022 | Fukuzumi | G11C 16/32 |
| 2022/0199641 | A1* | 6/2022 | Fukuzumi | H10B 43/10 |
| 2022/0246681 | A1* | 8/2022 | Parekh | H01L 25/16 |
| 2022/0320134 | A1* | 10/2022 | Park | H10B 41/10 |
| 2022/0328516 | A1* | 10/2022 | Yamazaki | H10B 43/35 |
| 2022/0351785 | A1* | 11/2022 | Fukuzumi | G11C 11/5642 |
| 2022/0359767 | A1* | 11/2022 | Goda | H10D 30/693 |
| 2022/0392914 | A1* | 12/2022 | Meotto | H10B 43/35 |
| 2023/0052468 | A1* | 2/2023 | Barclay | H01L 21/76895 |
| 2023/0066753 | A1* | 3/2023 | Bicksler | H10B 41/41 |
| 2023/0101111 | A1* | 3/2023 | Shivaraman | H01L 28/90 |
| | | | | 257/295 |

(56) References Cited

U.S. PATENT DOCUMENTS

| | | | |
|---|---|---|---|
| 2023/0143421 A1* | 5/2023 | Tanaka | G11C 11/4091 |
| | | | 365/63 |
| 2023/0253043 A1* | 8/2023 | Clampitt | H10B 43/27 |
| | | | 257/314 |
| 2024/0057337 A1* | 2/2024 | King | H10B 43/10 |
| 2024/0099031 A1* | 3/2024 | Hashimoto | H10B 43/35 |
| 2024/0203791 A1* | 6/2024 | Hopkins | H10B 41/27 |
| 2024/0284675 A1* | 8/2024 | Fayrushin | H10B 43/10 |
| 2025/0063734 A1* | 2/2025 | Howder | H10B 43/27 |
| 2025/0069950 A1* | 2/2025 | Manthena | H10B 41/35 |
| 2025/0098158 A1* | 3/2025 | Luo | H01L 23/528 |

* cited by examiner

ELECTRONIC DEVICES INCLUDING VERTICAL STRINGS OF MEMORY CELLS, AND RELATED MEMORY DEVICES, SYSTEMS AND METHODS

TECHNICAL FIELD

Embodiments disclosed herein relate to the field of electronic device design and fabrication. More particularly, embodiments of the disclosure relate to electronic devices including vertical strings of memory cells (e.g., NAND memory cells) and related memory devices, systems, and methods.

BACKGROUND

Electronic device (e.g., semiconductor device, memory device) designers often desire to increase the level of integration or density of features (e.g., components) within an electronic device by reducing the dimensions of the individual features and by reducing the separation distance between neighboring features. Electronic device designers also desire to design architectures that are not only compact, but offer performance advantages, as well as simplified designs. Reducing the dimensions and spacing of features has placed increasing demands on the methods used to form the electronic devices. One solution has been to form three-dimensional (3D) electronic devices, such as 3D NAND devices, in which memory cells are positioned vertically on a substrate. An example of a conventional vertical memory array includes strings of memory cells vertically extending through openings in one or more decks (e.g., stack structures) including tiers of conductive structures and insulative structures. Each string of memory cells may include at least one select device coupled thereto. Such a configuration permits a greater number of switching devices (e.g., access devices, transistors) to be located in a unit of die area (i.e., length and width of active surface consumed) by building the array upwards (e.g., vertically) on a die, as compared to structures with conventional planar (e.g., two-dimensional) arrangements of transistors.

As technology advances in 3D electronic devices, arrays of vertical strings of memory cells are being produced and designed with an increased number of alternating conductive materials and dielectric materials to increase a number of memory cell access devices. This increase results in a stack with a greater height, as well as larger vertical strings of memory cells passing through the stack with the greater height. Semiconductive materials (e.g., channel materials) in the larger vertical strings of memory cells may need to carry an increased current, a so-called "string current," to effectively operate all the memory cells in the vertical string. Insufficient string current may reduce reliability of the vertical strings of memory cells.

DETAILED DESCRIPTION

Figure 1A:
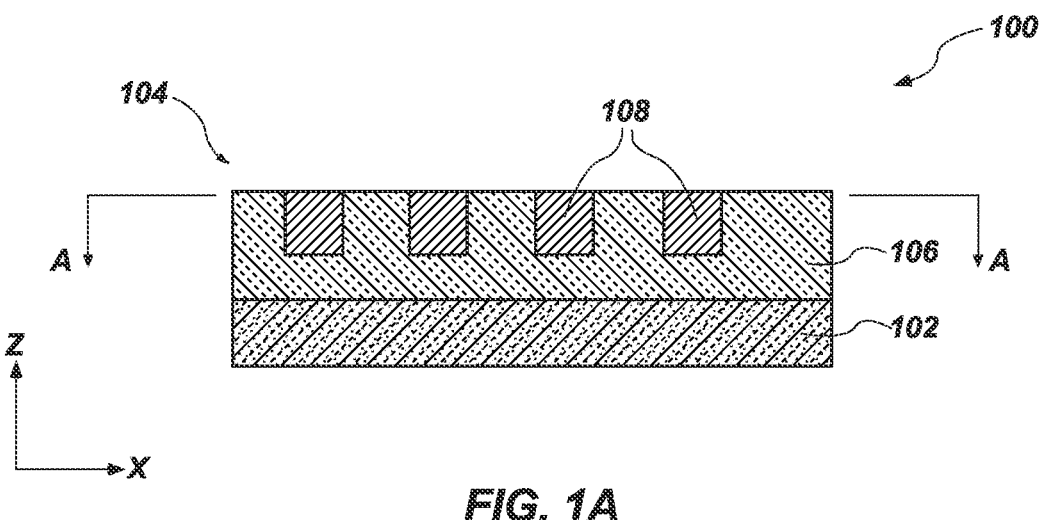
FIGS. 1A through 1N are simplified partial cross-sectional (FIGS. 1A, 1C, 1D, and 1F-1N) and simplified partial top-down (FIGS. 1B and 1E) views illustrating a method of forming an electronic device, in accordance with embodiments of the disclosure, where the top-down views of FIGS. 1B and 1E are taken along the A-A line and the B-B line in FIGS. 1A and 1D, respectively.

An electronic device (e.g., an apparatus, a semiconductor device, a memory device) that includes sense devices (e.g., sense transistors) within a source tier is disclosed. The electronic device includes a stack comprising tiers of alternating conductive structures and insulative structures overlying the source tier. A pillar comprising a channel material extends vertically through the stack. A sense device comprising a gate material is located within the source tier. The channel material of the pillar, in combination with the gate material of the sense device, forms an extended gate region (e.g., a gate) of the sense device. The gate material of the sense device may be in electrical communication (e.g., in vertical alignment) with the channel material of the pillar. Any number of the pillars and associated sense devices may be formed in a repeating pattern (e.g., an array) within the electronic device.

In some embodiments, the sense device may be associated with a single pillar of the stack. For example, the gate material of the sense device may be vertically aligned and in direct physical contact with the channel material of the pillar. The channel material of the pillar may exhibit a width that is relatively less than a width of the gate material of the sense device. A source material (e.g., a source plate) of the source tier may serve as (e.g., function as) a source region of the sense device and individual conductive lines of the source tier may serve as a drain region of a respective sense device. The conductive lines of the source tier may extend orthogonal to a direction of the conductive structures of the stack and substantially parallel to a direction of data lines (e.g., bit lines) overlying the stack. In some embodiments, the channel material of the pillar, in combination with the gate material of the sense device, provides an extended gate region of the sense device. In other words, individual strings of memory cells may be configured as a gate of a respective one of the sense devices. Providing the sense device within the source tier and utilizing an extended gate region as a gate of the sense device may facilitate a reduced (e.g., relaxed) current requirement of a so-called "string current" needed to effectively operate all of the memory cells in individual strings of the memory cells during operations of the electronic device. By using the individual strings (e.g., NAND strings) as gates for the sense devices, a string current requirement may be substantially changed (e.g., substantially reduced) and degradation of the string current may be substantially minimized (e.g., substantially eliminated). Such a configuration may provide, at least in part, a substantially different (e.g., substantially reduced) string current requirement for the individual strings of the memory cells without significantly affecting conductivity.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional electronic device fabrication techniques employed in the industry. In addition, the description provided below does not form a complete process flow for manufacturing an electronic device (e.g., a memory device, such as 3D NAND Flash memory device). The structures described below do not form a complete electronic device. Only those process acts and structures necessary to understand the embodiments of the disclosure are described in detail below. Additional acts to form a complete electronic device from the structures may be performed by conventional fabrication techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, the term "configured" refers to a size, shape, material composition, and arrangement of one or more of at least one structure and at least one apparatus facilitating operation of one or more of the structure and the apparatus in a pre-determined way.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), an electronic device combining logic and memory, or a graphics processing unit (GPU) incorporating memory.

As used herein, the term "electronic device" includes, without limitation, a memory device, as well as a semiconductor device which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "dielectric material" means and includes an electrically insulative material. The dielectric material may include, but is not limited to, one or more of an insulative oxide material or an insulative nitride material. The insulative oxide may be a silicon oxide material, a metal oxide material, or a combination thereof. The insulative oxide may include, but is not limited to, a silicon oxide $(SiO_x,$ silicon dioxide $(SiO_2))$, phosphosilicate glass, borosilicate glass, borophosphosilicate glass, fluorosilicate glass, aluminum oxide $(AlO_x)$, gadolinium oxide $(GdO_x)$, hafnium oxide $(HfO_x)$, magnesium oxide $(MgO_x)$, niobium oxide $(NbO_x)$, tantalum oxide $(TaO_x)$, titanium oxide $(TiO_x)$, zirconium oxide $(ZrO_x)$, hafnium silicate, a dielectric oxynitride material (e.g., $SiO_xN_y$), a dielectric carboxynitride material (e.g., $SiO_xC_zN_y$), a combination thereof, or a combination of one or more of the listed materials with silicon oxide. The insulative nitride material may include, but is not limited to, silicon nitride.

As used herein, the term "conductive material" means and includes an electrically conductive material. The conductive material may include one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride $(WN_y)$, tungsten silicide $(WSi_x)$, nickel (Ni), tantalum (Ta), tantalum nitride $(TaN_y)$, tantalum silicide $(TaSi_x)$, platinum (Pt), copper (Cu), silver (Ag), gold (Au), aluminum (Al), molybdenum (Mo), titanium (Ti), titanium nitride $(TiN_y)$, titanium silicide $(TiSi_x)$, titanium silicon nitride $(TiSi_xN_y)$, titanium aluminum nitride $(TiAl_xN_y)$, molybdenum nitride $(MoN_x)$, iridium (Ir), iridium oxide $(IrO_z)$, ruthenium (Ru), ruthenium oxide $(RuO_z)$, n-doped polysilicon, p-doped polysilicon, undoped polysilicon, and conductively doped silicon.

As used herein, a "conductive structure" means and includes a structure formed of and including one or more conductive materials.

As used herein, "insulative material" means and includes electrically insulative material, such one or more of at least one dielectric oxide material (e.g., one or more of a silicon oxide $(SiO_x)$, phosphosilicate glass, borosilicate glass, borophosphosilicate glass, fluorosilicate glass, an aluminum oxide $(AlO_x)$, a hafnium oxide $(HfO_x)$, a niobium oxide $(NbO_x)$, a titanium oxide $(TiO_x)$, a zirconium oxide $(ZrO_x)$, a tantalum oxide $(TaO_x)$, and a magnesium oxide (MgO)), at least one dielectric nitride material (e.g., a silicon nitride $(SiN_y)$), at least one dielectric oxynitride material (e.g., a silicon oxynitride $(SiO_xN_y)$), and at least one dielectric carboxynitride material (e.g., a silicon carboxynitride $(SiO_xC_zN_y)$). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions.

As used herein, an "insulative structure" means and includes a structure formed of and including an insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

Figure 1B:
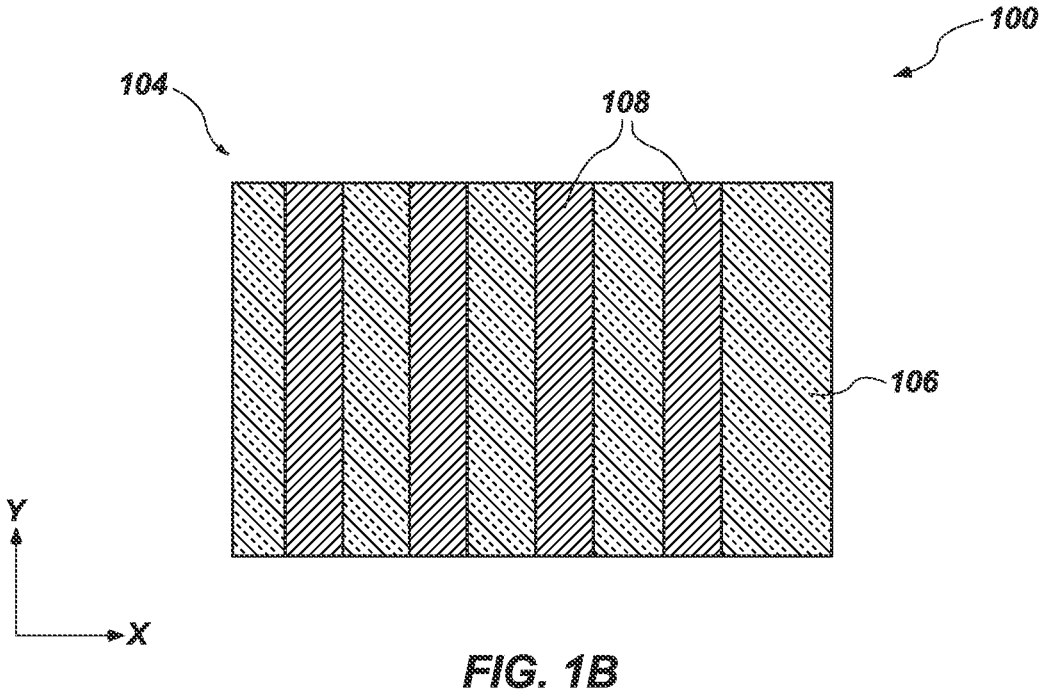
Figures 1C, 1D, 1E:
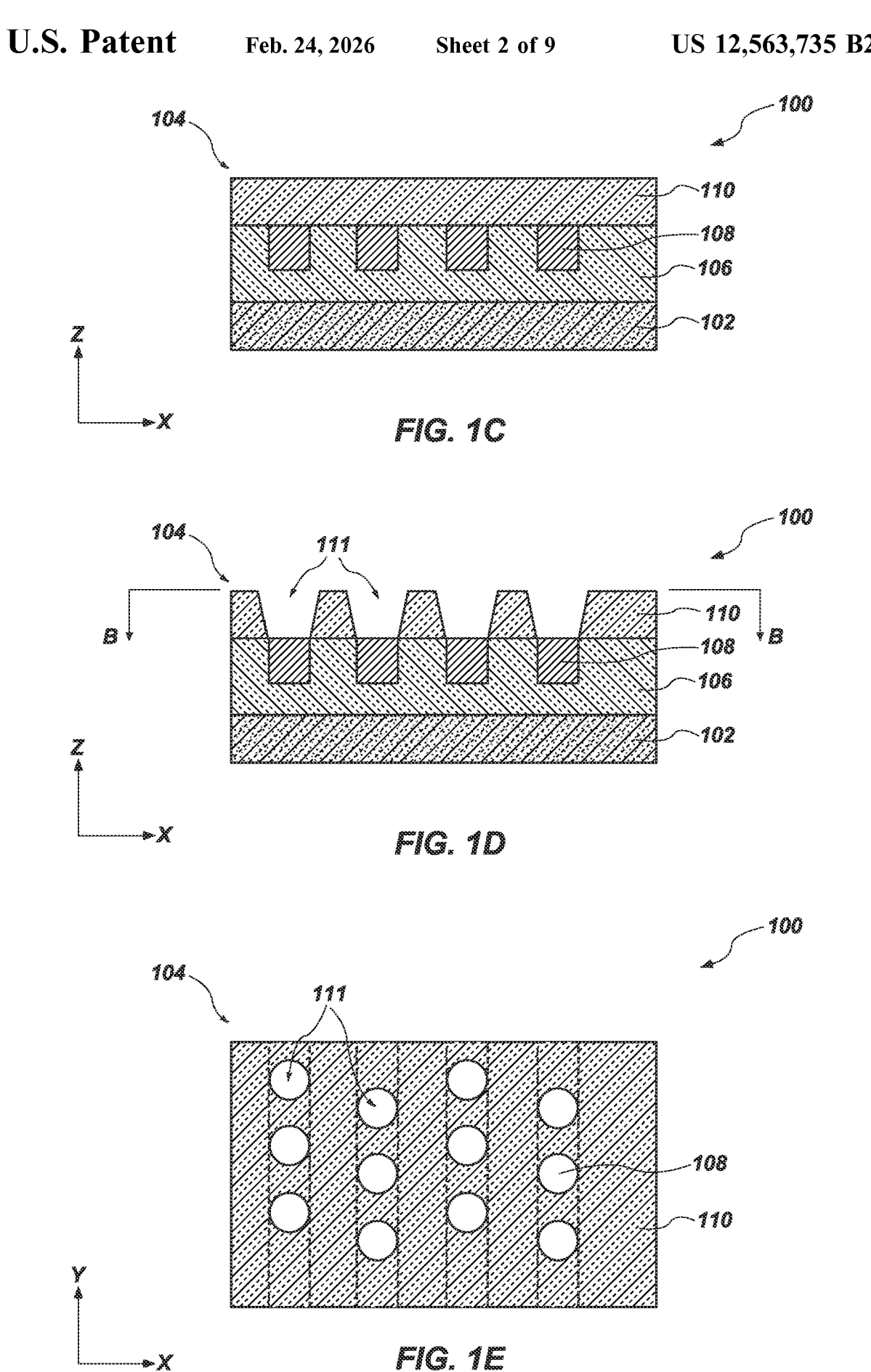
Figures 1F, 1G, 1H:
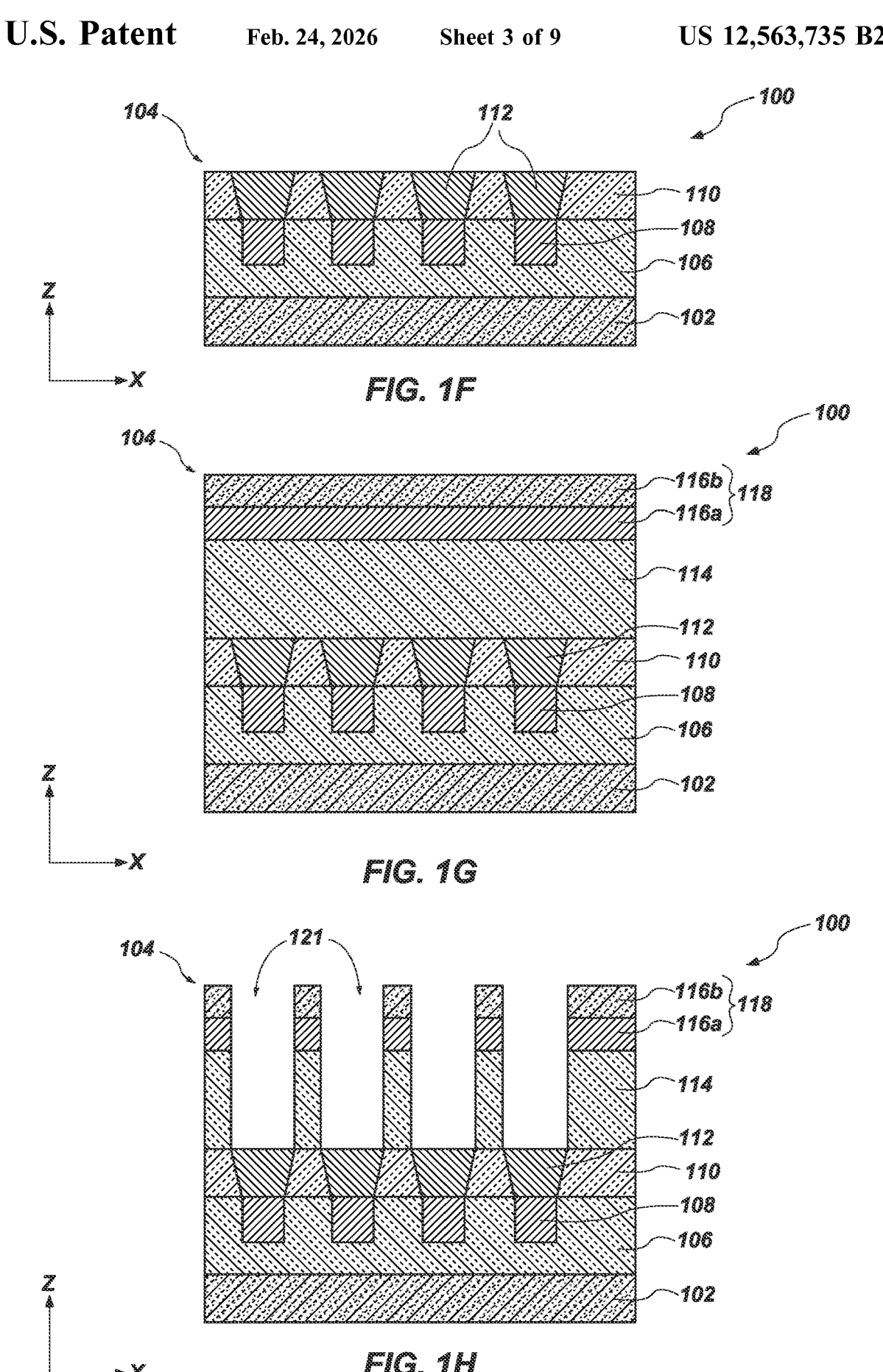
Figures 1I, 1J, 1K:
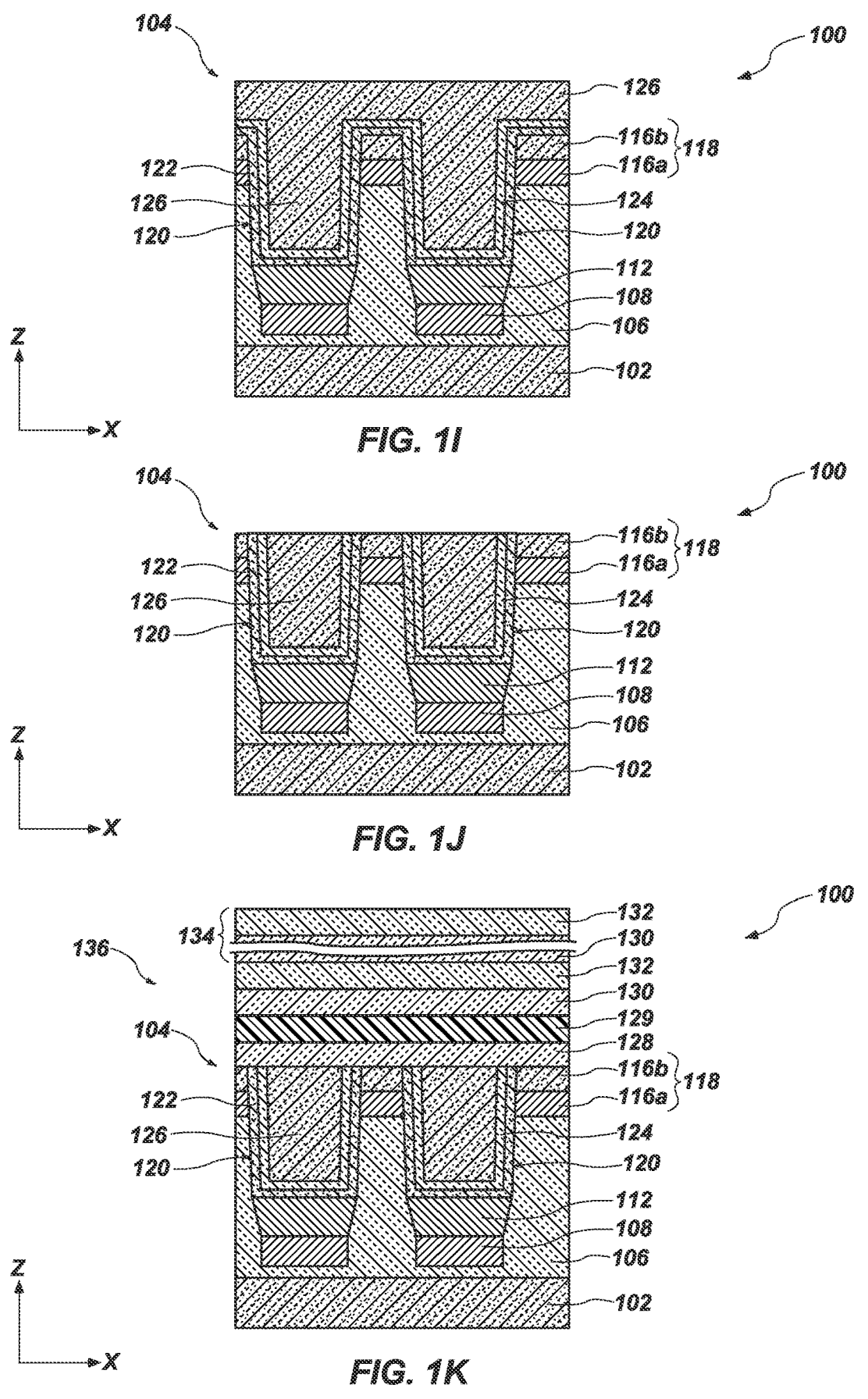
Figure 1L:
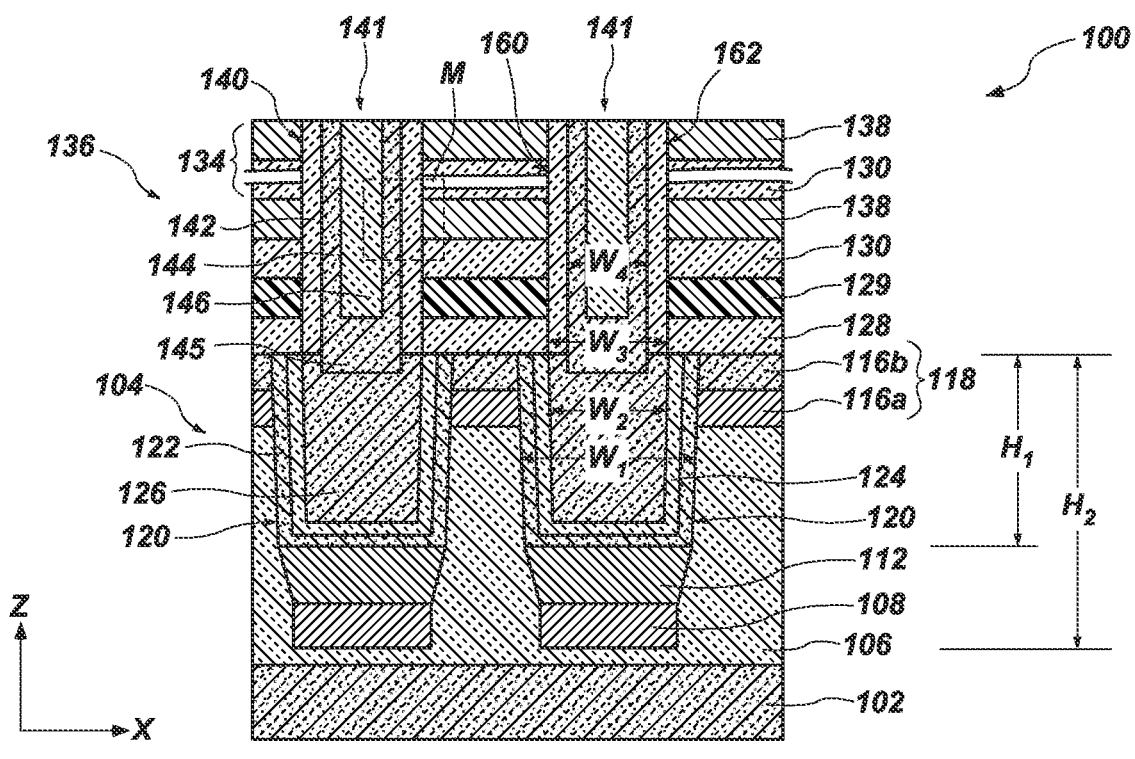
Figure 1M:
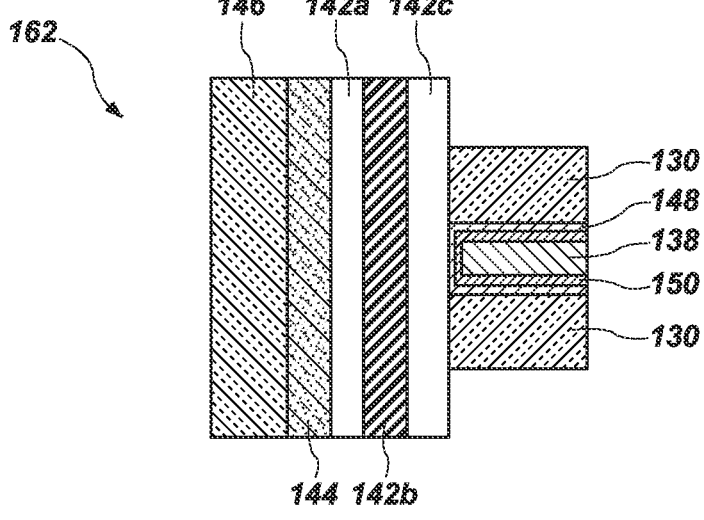
Figure 1N:
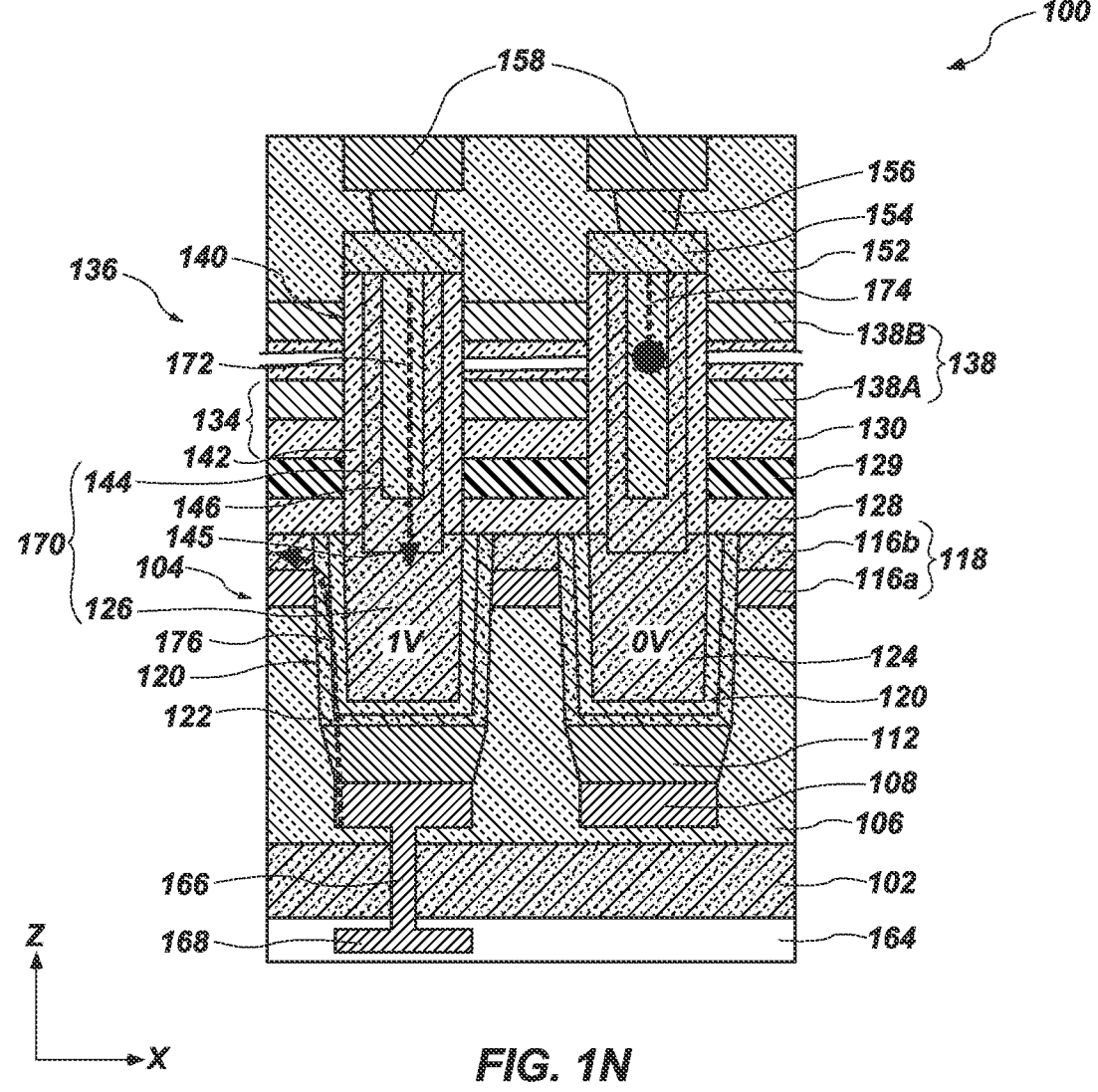

FIGS. 1A through 1N illustrate a method of forming an electronic device (e.g., a memory device, such as a 3D NAND Flash memory device), in accordance with embodiments of the disclosure, of which FIGS. 1B and 1E are simplified partial top-down views taken along the A-A line and the B-B line in FIGS. 1A and 1D, respectively. FIG. 1M is an enlargement of the portion of FIG. 1L indicated by the dashed line of box M. Referring to FIG. 1A, an electronic device 100 may be formed to include source-level conductive lines 108 (e.g., lower data lines, lower bit lines, lower digit lines) in one or more insulative materials 106 adjacent to (e.g., vertically adjacent to, on) a base material 102 (e.g., a substrate). The source-level conductive lines 108 may be included, for example, within a source tier 104 (e.g., a source level) of the electronic device 100. In some embodiments, the source tier 104, including the source-level conductive lines 108, may be formed adjacent to (e.g., on or over) the base material 102. While not illustrated in FIG. 1A, complementary metal-oxide-semiconductor (CMOS) circuitry may, for example, be present below the base material 102, as described in greater detail with reference to FIG. 1N. In other embodiments, the electronic device 100 may not include the base material 102 and the insulative materials 106 may be formed adjacent to (e.g., on or over) the CMOS circuitry.

The base material 102, if present, may include a semiconductor substrate, a base semiconductor material on a supporting substrate, a metal electrode, or a semiconductor substrate having one or more materials, structures, or regions formed thereon. The base material 102 may be a conventional silicon substrate or other bulk substrate including a semiconductor material.

The insulative materials 106 may be formed of and include, for example, at least one dielectric material, such as at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$). In some embodiments, the insulative materials 106 are formed of and include $SiO_2$. The insulative materials 106 may be located adjacent (e.g., directly adjacent) to the base material 102 or, alternatively, to the CMOS circuitry.

The source-level conductive lines 108 may be formed of and include at least one electrically conductive material, such as one or more of a metal, an alloy, a conductive metal oxide, a conductive metal nitride, a conductive metal silicide, and a conductively doped semiconductor material. In some embodiments, the source-level conductive lines 108 are formed of doped polysilicon. In other embodiments, the source-level conductive lines 108 are formed of tungsten silicide. The source-level conductive lines 108 may be electrically connected to sense circuitry (e.g., sense amplifiers) of the CMOS circuitry and may provide electrical access to strings of memory cells, as described in greater detail below.

The source-level conductive lines 108 may be formed using one or more conventional deposition processes, such as one or more of a conventional ALD process, a conventional CVD process, and a conventional PVD process. In some embodiments, portions of the insulative materials 106 overlying the base material 102 are removed (e.g., through a conventional photolithographic patterning and etching process) to form openings overlying the base material 102; a conductive material is formed (e.g., deposited) into the openings; and excess portions of the conductive material are removed (e.g., through a CMP process) to form the source-level conductive lines 108 of the source tier 104. Each of the source-level conductive lines 108 may be at least partially (e.g., substantially) horizontally aligned in a first horizontal direction (e.g., the X-direction). As best shown in FIG. 1B, elongated portions of the source-level conductive lines 108 extend in a second horizontal direction (e.g., the Y-direction)

substantially orthogonal to each of the first horizontal direction and a vertical direction (e.g., the Z-direction). The source-level conductive lines 108 may, for example, serve as (e.g., function as) drain regions of sense devices of the source tier 104. Once formed, the source tier 104 may be defined, in part, by the source-level conductive lines 108, as well as by subsequently formed materials, as described in greater detail with reference to FIGS. 1F through 1J. While FIGS. 1A and 1B illustrate four of the source-level conductive lines 108, additional source-level conductive lines 108 may be present depending on the desired configuration of the electronic device 100.

With reference to FIG. 1C, additional insulative materials (e.g., a first insulative material 110) may be formed on or over upper surfaces of the insulative materials 106 and the source-level conductive lines 108. The first insulative material 110 may be formed of and include at least one dielectric material. In some embodiments, the first insulative material 110 is formed of and includes $SiO_2$. The first insulative material 110 may or may not include substantially the same material composition as the insulative materials 106. The first insulative material 110 may be formed using one or more conventional processes (e.g., conventional deposition processes, such as one or more of spin-on coating, blanket coating, CVD and PVD; conventional material removal processes, such as a conventional CMP process) and conventional processing equipment, which are not described in detail herein.

With reference to FIG. 1D in combination with FIG. 1E, portions of the first insulative material 110 overlying the source-level conductive lines 108 may be removed (e.g., through a conventional photolithographic patterning and etching process) to form openings 111 (e.g., plug openings) overlying the source-level conductive lines 108. The openings 111 in the first insulative material 110 may be laterally aligned in columns extending in the Y-direction with individual openings 111 positioned out of lateral alignment (e.g., staggered) with adjacent rows of the openings 111 extending in the X-direction, as shown in FIG. 1E. In other words, at least some of the openings 111 may be aligned with each other (e.g., in the Y-direction) and offset from one other (e.g., in the X-direction). For example, the openings 111 of a single column may be laterally aligned (e.g., in the Y-direction) and the openings 111 of a single row may be laterally offset (e.g., in the X-direction) from openings 111 in a neighboring (e.g., adjacent) row. In addition, the openings 111 of every other row may be laterally aligned (e.g., in the X-direction), although other configurations of the openings 111 relative to the source-level conductive lines 108 (shown in dashed lines) may be contemplated. The openings 111 may be formed in locations that may be selected at least partially based on desired locations of additional structures (e.g., sense devices, pillars) to be formed through subsequent processing of the electronic device 100, as described in further detail below with reference to FIGS. 1I and 1L.

With reference to FIG. 1F, lower conductive plugs 112 (e.g., contacts, lower data line contacts) may be formed within the openings 111 (FIG. 1D). For example, the lower conductive plugs 112 may extend through the first insulative material 110 and may be formed on or over the upper surfaces of the source-level conductive lines 108. The lower conductive plugs 112 may each include outer side surfaces, upper surfaces, and lower surfaces on or over (e.g., directly vertically adjacent to) the upper surfaces of the source-level conductive lines 108. The lower conductive plugs 112 may be formed using one or more conventional processes (e.g., conventional deposition processes, conventional material removal processes) and conventional processing equipment. For example, a conductive material may be formed (e.g., deposited) into the openings 111 and excess portions of the conductive material may be removed (e.g., through a CMP process) to form the lower conductive plugs 112. Prior to forming the lower conductive plugs 112 within the openings 111, exposed upper surfaces of the source-level conductive lines 108 may be cleaned using a selective etchant, for example, to enable direct contact between adjacent materials of the source-level conductive lines 108 and the lower conductive plugs 112.

The lower conductive plugs 112 may be formed of and include at least one semiconductor material or at least one conductive material. In some embodiments, the lower conductive plugs 112 may comprise a semiconductor material, such as one or more of polysilicon, silicon germanium, and germanium. The lower conductive plugs 112 may be undoped, or may include at least one dopant, such as a p-type dopant or an n-type dopant. In other embodiments, the lower conductive plugs 112 are formed of and include W.

Outer side surfaces (e.g., sidewalls) of the lower conductive plugs 112 may exhibit a tapered profile with an upper portion of individual lower conductive plugs 112 having a greater critical dimension (e.g., width) than a lower portion thereof, as shown in FIG. 1F. In other embodiments, the lower conductive plugs 112 have a different profile, for example, a substantially rectangular profile, a dish-shaped profile, or any other three-dimensional shape, such that portions (e.g., a lateral extent of the upper surfaces) of the lower conductive plugs 112 extend beyond sidewalls of the source-level conductive lines 108 in at least one lateral direction (e.g., the X-direction).

With reference to FIG. 1G, an additional portion of dielectric material, a second insulative material 114, may be formed on or over the upper surfaces of the first insulative material 110 and the lower conductive plugs 112. The second insulative material 114 may be formed of and include at least one dielectric material. In some embodiments, the second insulative material 114 is formed of and includes $SiO_2$. The first insulative material 110 and the second insulative material 114 may or may not include substantially the same material composition as one another and as the insulative materials 106.

A first material 116a of a source-level conductive structure 118 (e.g., a source region, a source plate) of the source tier 104 may be formed adjacent to (e.g., on or over) an upper surface of the second insulative material 114, and a second material 116b of the source-level conductive structure 118 may be formed adjacent to (e.g., on or over) an upper surface of the first material 116a. In some embodiments, the first material 116a is formed of and includes a conductive material, such as a metal-containing material (e.g., a tungsten-containing material) or other conventional material. The second material 116b may be formed of and include, but is not limited to, polysilicon. The second material 116b may be formed adjacent (e.g., directly adjacent) to and in contact with the first material 116a, forming the source-level conductive structure 118. In other embodiments, the material compositions of the first material 116a and the second material 116b may be reversed such that the source-level conductive structure 118 includes a conductive material (e.g., a metal-containing material) overlying a semiconductive material (e.g., a polysilicon material). In yet other embodiments, the source-level conductive structure 118 may include a single material or, alternatively, multiple (e.g., three or more) materials. In other words, one or more conductive materials or semiconductive materials may vertically intervene between neighboring regions of additional conductive materials or semiconductive materials. For example, the source-level conductive structure 118 may be formed to include a single (e.g., one) material, two materials (e.g., a bi-layer structure), or three materials (e.g., a tri-layer structure). One or more materials of the source-level conductive structure 118 (e.g., the second material 116b) may, for example, serve as source regions of the sense devices of the source tier 104. Alternatively, the source-level conductive structure 118 may serve as the drain regions of the sense devices of the source tier 104 and the source-level conductive lines 108 may serve as the source regions thereof.

The first material 116a and the second material 116b may individually be formed using one or more conventional deposition processes, such as one or more of a conventional ALD process, a conventional CVD process, and a conventional PVD process. For example, the first material 116a may be formed to exhibit a substantially continuous, flat material surface over the upper surface of the second insulative material 114 and the second material 116b may be formed to exhibit a substantially continuous, flat material surface over the upper surface of the first material 116a. In other words, one or more (e.g., each) of the first material 116a and the second material 116b of the source-level conductive structure 118 may include a substantially continuous material (e.g., a substantially continuous sheet, a substantially continuous plate) extending in each of the X-direction and the Y-direction, although other configurations of the source-level conductive structure 118 may be contemplated. The source-level conductive structure 118, including the first material 116a and the second material 116b, may exhibit a desired thickness, and the upper surface of the source-level conductive structure 118 may be substantially planar.

With reference to FIG. 1H, portions of the source-level conductive structure 118, including the first material 116a and the second material 116b, and the second insulative material 114 may be removed (e.g., through one or more conventional photolithographic patterning and etching processes) to form additional openings 121 (e.g., sense device openings, string follower openings) to expose upper surfaces of the lower conductive plugs 112. In some embodiments, lateral boundaries of the additional openings 121 are aligned with outer side surfaces of the lower conductive plugs 112. In other words, the additional openings 121 may extend across, or beyond, a full lateral extent of the upper surfaces of the lower conductive plugs 112. In other embodiments, the lateral boundaries of the additional openings 121 are offset (e.g., positioned off-center or staggered) relative to the outer side surfaces of the lower conductive plugs 112. Sidewalls of the additional openings 121 defined by second insulative material 114 and the materials of the source-level conductive structure 118 may be sloped (e.g., tapered) with an upper portion of the additional openings 121 having a greater lateral extent (e.g., width) than a lowermost portion thereof or, alternatively, the sidewalls of the additional openings 121 may be substantially vertical.

With reference to FIG. 1I, a channel material 122 of a sense device 120 (e.g., a sense transistor, a string follower device) may be formed within the additional openings 121 (FIG. 1H) and over exposed upper surfaces of the second material 116b of the source-level conductive structure 118. The channel material 122 (e.g., a thin channel) may be formed as a so-called "doped hollow channel" (DHC). The channel material 122 may be formed adjacent to (e.g., on) sidewalls of each of the source-level conductive structure 118, including the first material 116a and the second material 116*b*, and the second insulative material 114. A gate dielectric material 124 may be formed on or over the channel material 122 and a gate material 126 (e.g., a gate region, a gate structure) of the sense device 120 may be formed on or over the gate dielectric material 124. In some embodiments, each of the channel material 122, the gate dielectric material 124, and the gate material 126 extend through the source-level conductive structure 118, including the first material 116*a* and the second material 116*b*, and the second insulative material 114 and are formed on or over upper surfaces of the lower conductive plugs 112, as shown in FIG. 1I. For ease of understanding the disclosure, the insulative materials 106, the first insulative material 110, and the second insulative material 114 are hereinafter collectively referred to as the insulative materials 106, as shown in FIG. 1I. The insulative materials 106 may be homogeneous (e.g., may include a single material), or may be heterogeneous (e.g., may include a stack including at least two different materials).

In other embodiments, the channel material 122 and the gate dielectric material 124 may extend adjacent to (e.g., on) sidewalls of each of the source-level conductive structure 118 and the second insulative material 114 without extending on or over the upper surfaces of the lower conductive plugs 112. In such embodiments, portions of the channel material 122 may initially be formed adjacent to (e.g., on or over) the exposed upper surfaces of the lower conductive plugs 112 and portions of the gate dielectric material 124 may initially be formed adjacent to (e.g., on or over) the channel material 122. Prior to formation of the gate material 126, portions of the channel material 122 and the gate dielectric material 124 may be removed from the upper surfaces of the lower conductive plugs 112 using one or more conventional removal processes, such as one or more so-called "punch etch" processes. In other words, the lower surfaces of the gate material 126 may be adjacent to (e.g., directly contacting) the upper surfaces of the lower conductive plugs 112 in such embodiments.

Once formed, individual sense devices 120 are spaced apart from one another in at least one horizontal direction (the X-direction, the Y-direction). In other words, the individual sense devices 120 may include discrete (e.g., discontinuous) structures in at least one horizontal direction. As used herein, the term "discrete" means and includes a material or structure that is defined by one or more differing materials or structures. For example, the second insulative material 114 and the materials of the source-level conductive structure 118 substantially laterally surround (e.g., substantially continuously laterally surround) the individual sense devices 120. Further, the individual sense devices 120 may be associated (e.g., in vertical alignment) with a respective one of pillars 140 (see FIG. 1L) of stack 136 (see FIG. 1K). Since the lower conductive plugs 112 are formed in the openings 111 (FIG. 1E) that are staggered, alignment of the sense device 120 and the respective pillars 140 may be staggered, such that a first row of aligned sense devices 120 is offset from a second row of aligned sense devices 120 immediately adjacent to the first row. For clarity and convenience, only two sense devices 120 and associated pillars 140 are illustrated in FIGS. 1I through 1N, although it is understood that additional sense devices 120 and the pillars 140 may be formed in a repeating pattern (e.g., an array) within the electronic device 100.

The channel material 122 of the sense device 120 may be formed of and include one or more of at least one semiconductor material (at least one elemental semiconductor material, such as polycrystalline silicon, at least one III-V compound semiconductor material, at least one II-VI compound semiconductor material, at least one organic semiconductor material, GaAs, InP, GaP, GaN, other semiconductor materials), and at least one oxide semiconductor material. The channel material 122 may include amorphous silicon or polycrystalline silicon. The channel material 122 may be formed by a conformal deposition process, such as CVD or ALD. The channel material 122 may alternatively be epitaxially grown within the additional openings 121. The channel material 122 may be formed to any desirable thickness. By way of non-limiting example, the channel material 122 may have an average thickness (e.g., width) less than about 25 nanometers (nm), such as within a range of from about 1 nm to about 10 nm or from about 10 nm to about 20 nm. The channel material 122 may or may not exhibit a substantially homogeneous distribution of the elements thereof. The channel material 122 may be, in whole or in part, crystalline (e.g., monocrystalline, polycrystalline) or amorphous.

The channel material 122 may be undoped, or may include at least one dopant, such as a p-type dopant or an n-type dopant. In some embodiments, the at least one dopant may include a p-type dopant comprising boron (B), aluminum (Al), or gallium (Ga), for example. In other embodiments, the at least one dopant may be an n-type dopant including, but not limited to, antimony (Sb), bismuth (Bi), phosphorous (P), or arsenic (As). For example, the dopants of the lower conductive plugs 112 and the channel material 122 may be the same type (e.g., an n-type dopant) having differing concentrations relative to one another. By way of non-limiting example, the lower conductive plugs 112 may include a first concentration of an n-type dopant and the channel material 122 may include a second concentration of an n-type dopant that is relatively lower than the first concentration. During use and operation of the electronic device 100, a threshold voltage ($V_{TH}$) of the sense device 120 may depend, at least in part, on properties (e.g., concentration) of the at least one dopant of the channel material 122.

The gate dielectric material 124 may be formed of and include one or more of silicon dioxide, silicon oxynitride, phosphosilicate glass, borosilicate glass, borophosphosilicate glass (BPSG), fluorosilicate glass, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), a dielectric carboxynitride material (e.g., silicon carboxynitride (SiOCN)), or combinations thereof. In some embodiments, the gate dielectric material 124 comprises silicon dioxide. The gate dielectric material 124 may or may not include substantially the same material composition as one or more of the insulative materials 106. The gate dielectric material 124 may be formed by a conformal deposition process, such as CVD or ALD.

The gate material 126 may be formed (e.g., non-conformally formed) inwardly laterally adjacent to the gate dielectric material 124 within the additional openings 121 (FIG. 1H) and over exposed upper surfaces of the gate dielectric material 124 or, alternatively, over an exposed upper surface of the lower conductive plugs 112. For example, the gate material 126 may be formed using one or more conventional non-conformal deposition processes, such as one or more of a conventional PVD process (e.g., a conventional radio frequency PVD (RFPVD) process), or a conventional non-conformal CVD process. The gate material 126 may alternatively be epitaxially grown within the additional openings 121. The gate material 126 may substantially completely fill a remainder of the additional openings 121 (e.g., a substantial cylindrical opening) so as to fully laterally extend between the sidewalls of the gate dielectric material 124 within the additional openings 121.

The gate material 126 may be formed of and include one or more of at least one semiconductor material (at least one elemental semiconductor material, such as polycrystalline silicon, at least one III-V compound semiconductor material, at least one II-VI compound semiconductor material, at least one organic semiconductor material, GaAs, InP, GaP, GaN, other semiconductor materials), and at least one oxide semiconductor material. For example, the gate material 126 may include amorphous silicon or polycrystalline silicon. In other embodiments, the gate material 126 is formed of and includes W, for example, if an ohmic connection (e.g., a direct ohmic connection) may be made between the gate material 126 and channel materials of subsequently formed pillars. The gate material 126 may be homogeneous (e.g., may include a single material), or may be heterogeneous (e.g., may include at least two different materials). The gate material 126 may or may not include substantially the same material composition as the channel material 122.

The materials of the sense device 120 may individually be, in whole or in part, crystalline (e.g., monocrystalline) or amorphous in some embodiments. For example, one or both of the channel material 122 and the gate material 126 of the sense device 120 may be formed by depositing or growing a thin layer of silicon, such as amorphous silicon or poly-silicon, and thereafter fabricated to provide a material exhibiting a grain size of sufficient size to resemble monocrystalline silicon. By way of non-limiting example, the materials of the sense device 120 may be fabricated using one or more of a selective epitaxy process developed for so-called "raised source-drain" technology and a metal-induced lateral crystallization (MILC) technique developed for thin-film transistor technology. Accordingly, one or both of the channel material 122 and the gate material 126 may individually include a substantially monolithic structure in some embodiments. Providing materials fabricated using advanced crystallization techniques, for example, may significantly reduce defects to allow increased uniformity of a threshold voltage ($V_{TH}$) of the sense device 120 during use and operation of the electronic device 100.

The gate material 126 may be undoped, or may include at least one dopant. In some embodiments, the at least one dopant may be a p-type dopant comprising boron (B), aluminum (Al), or gallium (Ga), for example. In other embodiments, the at least one dopant may be an n-type dopant including, but not limited to, antimony (Sb), bismuth (Bi), phosphorous (P), or arsenic (As). In addition, the at least one dopant of the gate material 126 may be the same as, or different than, the at least one dopant of the channel material 122. For example, the at least one dopant of the gate material 126 may be a p-type dopant and the at least one dopant of the channel material 122 may be an n-type dopant. Alternatively, the dopants of the channel material 122 and the gate material 126 may be the same type (e.g., an n-type dopant) having differing concentrations relative to one another. By way of non-limiting example, the gate material 126 may include a first concentration of an n-type dopant and the channel material 122 may include a second concentration of an n-type dopant that is relatively lower than the first concentration. One or both of the channel material 122 and the gate material 126 may include a gradient of the at least one dopant, with a higher dopant concentration and a lower dopant concentration along a vertical portion (e.g., the Z-direction) and/or a horizontal portion (e.g., the X-direction) thereof. A boundary between a region of the higher dopant concentration and another region of the lower dopant concentration may not necessarily be along a straight line.

In additional embodiments, the sense device 120 may, optionally, be formed of and include additional materials. For example, the sense device 120 may include a cell film including a cell material (not shown) formed within the additional openings 121 (FIG. 1H) and a channel material (e.g., the channel material 122) formed adjacent (e.g., on or over) the cell material. The cell material and channel material are formed by conventional techniques, such as by CVD or ALD. In some embodiments, the cell material is formed by plasma enhanced ALD (PEALD). The cell material may, for example, be an oxide-nitride-oxide (ONO) material, such as a silicon oxide-silicon nitride-silicon oxide material, that is conformally formed adjacent to (e.g., on) sidewalls of each of the source-level conductive structure 118, including the first material 116*a* and the second material 116*b*, and the second insulative material 114. The channel material 122 may be conformally formed adjacent (e.g., over) the cell material. One of ordinary skill in the art will understand that selective placement of materials as well as formation of such materials, including types of materials, processing conditions (e.g., temperature, processing times, ratios of processing agents) and the like, may be selected to achieve the desired performance requirements by varying the materials, which variables may be adjusted (e.g., tuned) to achieve improved performance properties of the sense device 120.

With reference to FIG. 1J, following formation of the gate material 126 of the sense device 120, portions of the channel material 122, the gate dielectric material 124, and the gate material 126 may be subjected to at least one conventional planarization process (e.g., at least one conventional CMP process) to facilitate or enhance the planarity of an upper boundary (e.g., upper surface) thereof. Sidewalls of the sense device 120 may be sloped (e.g., tapered) with an upper portion of the sense device 120 having a greater lateral extent (e.g., width) than a lowermost portion thereof or, alternatively, the sidewalls of the sense device 120 may be substantially vertical. Formation of the channel material 122, the gate dielectric material 124, and the gate material 126 results in formation of the sense device 120. The sense device 120 may be defined, in whole or in part, by the channel material 122, the gate dielectric material 124, and the gate material 126. In turn, the source tier 104 may be defined, in whole or in part, by one or more of the sense devices 120, the source-level conductive structure 118, including the first material 116*a* and the second material 116*b*, the lower conductive plugs 112, and the source-level conductive lines 108. In other words, the source tier 104 including the sense device 120 may be formed in place of conventional source structures (e.g., source tiers, source plates) underlying a stack structure. Since the sense device 120 is formed within the source tier 104 underlying the stack 136, the sense device 120 may be characterized as a source-level sense device (e.g., a buried sense device).

With reference to FIG. 1K, following formation of the sense device 120 of the source tier 104, an additional portion of dielectric material, a third insulative material 128, may be formed adjacent to (e.g., on or over) upper surfaces of the first material 116*a* of the source-level conductive structure 118 and the sense device 120, including exposed upper surfaces of each of the channel material 122, the gate dielectric material 124, and the gate material 126. An etch stop material 129 may, optionally, be formed adjacent to (e.g., on or over) an upper surface of the third insulative material 128. The third insulative material 128 may be formed of and include at least one dielectric material. In some embodiments, the 128 is formed of and includes $SiO_2$. The third insulative material 128 may or may not include substantially the same material composition as one or more of the insulative materials 106.

The etch stop material 129, if present, may be formed of and include an insulative material that is different than, and is selectively etchable relative to, the third insulative material 128 and the materials of the sense device 120. The etch stop material 129 may be formed of and include at least one dielectric nitride material (e.g., $SiN_y$) or at least one oxynitride material (e.g., $SiO_xN_y$). In some embodiments, the etch stop material 129 is formed of and includes $Si_3N_4$. The etch stop material 129 may be formed adjacent (e.g., directly adjacent) to and in contact with the third insulative material 128. However, in some embodiments, the etch stop material 129 may not be present in the electronic device 100 and subsequent materials (e.g., insulative structures, conductive structures of a stack structure) may be formed directly on the upper surface of the third insulative material 128, for example. In some such embodiments, the third insulative material 128 may be formed of and include one or more dielectric oxide materials (e.g., aluminum oxide ($AlO_x$), hafnium oxide ($HfO_x$), niobium oxide ($NbO_x$), titanium oxide ($TiO_x$)) that is selectively etchable relative to one or more (e.g., each) of the underlying materials including the second material 116b of the source-level conductive structure 118 and the materials of the sense device 120 (e.g., the channel material 122, the gate dielectric material 124, the gate material 126).

As shown in FIG. 1K, the stack 136 (e.g., a stack structure) including a vertically (e.g., in the Z-direction) alternating sequence of insulative structures 130 and additional insulative structures 132 arranged in tiers 134 may be formed adjacent to (e.g., on or over) the source tier 104. Each of the tiers 134 may include at least one of the insulative structures 130 directly vertically adjacent at least one of the additional insulative structures 132. A lowermost one of the insulative structures 130 may be located adjacent to (e.g., on or over) the sense device 120 and the source-level conductive structure 118 of the source tier 104 with one or more of the third insulative material 128 and the etch stop material 129 intervening therebetween.

A number (e.g., quantity) of tiers 134 of the stack 136 may be within a range from about 32 of the tiers 134 to about 256 of the tiers 134. In some embodiments, the stack 136 includes about 128 of the tiers 134. However, the disclosure is not so limited, and the stack 136 may include a different number of the tiers 134. The stack 136 may comprise at least one (e.g., one, two, more than two) deck structure vertically overlying the sense device 120 and the source-level conductive structure 118 of the source tier 104. For example, the stack 136 may comprise a single deck structure or a dual deck structure (not shown) for a 3D memory device (e.g., a 3D NAND Flash memory device).

The insulative structures 130 may be formed of and include, for example, at least one dielectric material, such as at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$). In some embodiments, the insulative structures 130 are formed of and include $SiO_2$. The insulative structures 130 may or may not include substantially the same material composition as one or more of the third insulative material 128 and the insulative materials 106.

The additional insulative structures 132 may be formed of and include an insulative material that is different than, and is selectively etchable relative to, the insulative structures 130. The additional insulative structures 132 may be formed of and include at least one dielectric nitride material (e.g., $SiN_y$) or at least one oxynitride material (e.g., $SiO_xN_y$). In some embodiments, the additional insulative structures 132 comprise $Si_3N_4$. The additional insulative structures 132 may or may not include substantially the same material composition as the etch stop material 129, if present. As will be described herein, during fabrication of electronic device 100, one or more portions of the additional insulative structures 132 may be replaced to form conductive structures, such as select gate structures, which may comprise one or more select gate drain (SGD) structures, and an additional select gate structure, which may comprise a select gate source (SGS) structure.

With reference to FIG. 1L, the pillars 140 (e.g., cell pillars) of materials may vertically extend (e.g., in the Z-direction) through the stack 136. As described herein, the materials of the pillars 140 may form memory cells (e.g., strings of memory cells). A cell film of the pillars 140 may be formed (e.g., conformally formed) within pillar openings 141. Individual pillar openings 141 may be vertically aligned with a respective one of the sense devices 120 exposing a desired portion of the gate material 126 thereof. In other words, a single (e.g., one) of the pillars 140 may be formed adjacent to (e.g., in vertical alignment with) a single (e.g., one) of the sense devices 120, although other configurations of the individual pillars 140 relative to the respective sense devices 120 may be contemplated, so long as a single sense device 120 is in electrical communication with one of the pillars 140.

The cell film of the pillars 140 may include a cell material 142 formed within the pillar openings 141, and a channel material 144 formed adjacent (e.g., over) the cell material 142. Accordingly, the channel material 144 may exhibit a substantially U-shaped configuration having opposing sidewalls, as shown in FIG. 1L. In some embodiments, the channel material 144 of the cell film comprises a liner having a thickness less than about 25 nm, such as within a range of from about 5 nm to about 20 nm. The cell material 142 and channel material 144 are formed by conventional techniques, such as by CVD or ALD. In some embodiments, the cell material 142 is formed by plasma enhanced ALD (PEALD). The cell material 142 may, for example, be an oxide-nitride-oxide (ONO) material, such as a silicon oxide-silicon nitride-silicon oxide material, that is conformally formed on or over sidewalls of the pillars 140, as described in greater detail with reference to FIG. 1M.

The channel material 144 may be conformally formed adjacent (e.g., laterally adjacent) to the cell material 142. The channel material 144 may be formed along internal sidewalls of the cell material 142 and over an exposed upper surface of the gate material 126 of the sense device 120. In some embodiments, the channel material 144 of the pillars 140 extends to the upper surface of the gate material 126 of the sense device 120 such that a lower surface 145 of the channel material 144 is in contact (e.g., direct contact) and coincident with the upper surface of the gate material 126. In other embodiments, portions of the channel material 144 of the pillars 140 are recessed within the gate material 126 of the sense device 120 such that the lower surface 145 of the channel material 144 is at an elevational level below the upper surface of the gate material 126, as shown in FIG. 1L. In other words, lateral side surfaces (e.g., sidewalls) of the channel material 144 may directly contact portions of the gate material 126. Lower surfaces of the cell material 142 of the pillars 140 may be in contact (e.g., direct contact) and coincident with the upper surfaces of one or both of the gate material 126 and the gate dielectric material 124 of the sense device 120. The lower surfaces of the cell material 142 may also be in contact and coincident with the upper surfaces of one or both of the channel material 122 of the sense device 120 and the second material 116b of the source-level conductive structure 118, in some embodiments, so long as the channel material 144 is electrically isolated from each of the channel material 122 of the sense device 120 and the second material 116b of the source-level conductive structure 118.

The channel material 144 of the pillars 140 may be formed of and include one or more of at least one semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and at least one oxide semiconductor material. In some embodiments, the channel material 144 includes amorphous silicon or polycrystalline silicon. In some embodiments, the channel material 144 comprises a doped semiconductor material. In other embodiments, the channel material 144 is formed of and includes W. The channel material 144 of the pillars 140 may or may not include substantially the same material composition as one or both of the channel material 122 and the gate material 126 of the sense device 120.

A fill material 146 may be formed adjacent to (e.g., on or over) the channel material 144 of the cell film, substantially filling the pillar openings 141. The fill material 146 may be an insulative material, such as a silicon oxide material. For example, the fill material 146 may be a substantially uniform and conformal silicon oxide ($SiO_x$) material (e.g., a substantially uniform and conformal $SiO_2$ material). The fill material 146 may be substantially uniform and conformal as deposited. The fill material 146 may be formed by conventional techniques, such as by ALD. In some embodiments, the fill material 146 is an ALD $SiO_x$. The fill material 146 may initially be formed in the pillar openings 141 and over exposed horizontal surfaces of the stack 136, with the fill material 146 over the stack 136 subsequently removed, such as by an abrasive planarization process (e.g., chemical mechanical planarization (CMP)). Accordingly, the fill material 146 is surrounded by the cell material 142 and the channel material 144 of the cell film in the pillar openings 141.

The sense device 120 may exhibit a width $W_1$ (e.g., a horizontal dimension in the X-direction), and the pillars 140 may individually exhibit a width $W_3$ that is relatively less than the width $W_1$ of the sense device 120. By way of non-limiting example, the width $W_1$ of the sense device 120 may be within a range of from about 100 nm to about 250 nm, such as from about 100 nm to about 150 nm, from about 150 nm to about 200 nm, or from about 200 nm to about 250 nm, and the width $W_3$ of the individual pillars 140 may be within a range of from about 60 nm to about 120 nm, such as from about 60 nm to about 80 nm, from about 80 nm to about 100 nm, or from about 100 nm to about 120 nm.

The gate material 126 of the sense device 120 (e.g., taken from the upper surface thereof) may exhibit a width $W_2$, and the opposing sidewalls of the channel material 144 exhibiting the substantially U-shaped configuration of the pillars

140 may exhibit a width $W_4$ that is relatively less than the width $W_2$ of the gate material 126, such that portions (e.g., a lateral extent of the upper surfaces) of the gate material 126 extend beyond sidewalls of the channel material 144 of the pillars 140 in at least one lateral direction (e.g., the X-direction). By way of non-limiting example, the width $W_2$ of the gate material 126 of the sense device 120 may be within a range of from about 50 nm to about 200 nm, such as from about 50 nm to about 100 nm, from about 100 nm to about 150 nm, or from about 150 nm to about 200 nm, and the width $W_4$ of the channel material 144 of the pillars 140 may be within a range of from about 40 nm to about 80 nm, such as from about 40 nm to about 60 nm, or from about 60 nm to about 80 nm. However, the disclosure is not so limited and the widths may be different than those described.

A height $H_1$ of the sense device 120 (defined as a vertical dimension between an upper surface of the channel material 122 and a lower surface thereof) may be within a range of from about 50 nm to about 200 nm, such as from about 50 nm to about 75 nm, from about 75 nm to about 100 nm, from about 100 nm to about 150 nm, or from about 150 nm to about 200 nm. In some embodiments, upper surfaces of the channel material 122, the gate dielectric material 124, and the gate material 126 may be substantially coplanar with one another. Accordingly, the height $H_1$ of the sense device 120 may be defined as a vertical dimension between the upper surfaces of each of the channel material 122, the gate dielectric material 124, and the gate material 126 and the lower surface of the channel material 122 (e.g., an upper surface of the lower conductive plugs 112). A height $H_2$ of the source tier 104 (defined as a vertical dimension between the upper surfaces of the materials of the sense device 120 and a lower surface of the source-level conductive lines 108) may be within a range of from about 250 nm to about 1000 nm, such as from about 250 nm to about 350 nm, from about 350 nm to about 500 nm, from about 500 nm to about 650 nm, from about 650 nm to about 800 nm, or from about 800 nm to about 1000 nm. However, the disclosure is not so limited and the heights may be different than those described. In some embodiments, the upper surfaces of each of the channel material 122, the gate dielectric material 124, and the gate material 126 may be substantially coplanar with the upper surface of the second material 116b of the source-level conductive structure 118. Accordingly, the height $H_2$ of the source tier 104 may also be defined as a vertical dimension between the upper surface of the second material 116b of the source-level conductive structure 118 and the lower surface of the source-level conductive lines 108.

With continued reference to FIG. 1L, after forming the pillars 140, the additional insulative structures 132 (FIG. 1K) of the stack 136 may be at least partially (e.g., substantially) removed through slots, which may also be referred to as "slits" or "replacement gate slots," through a so-called "replacement gate" or "gate last" process. By way of non-limiting example, the additional insulative structures 132 may be removed by exposing the additional insulative structures 132 to at least one wet etchant comprising one or more of phosphoric acid, sulfuric acid, hydrochloric acid, nitric acid, or another material. In some embodiments, the additional insulative structures 132 are removed by exposing the additional insulative structures 132 to a so-called "wet nitride strip" comprising a wet etchant comprising phosphoric acid.

As shown in FIG. 1L, after removal of the additional insulative structures 132 (FIG. 1K), conductive structures 138 may be formed between vertically neighboring insulative structures 130 at locations corresponding to the previous locations of the additional insulative structures 132 to form the tiers 134 of the insulative structures 130 and the conductive structures 138, and strings 160 of memory cells 162 vertically extending through the stack 136. Since the individual pillars 140 are formed adjacent to a single sense device 120, a single (e.g., one) of the strings 160 of the memory cells 162 is associated with (e.g., in vertical alignment with) one of the sense devices 120, although other configurations of the individual strings 160 relative to the respective sense devices 120 may be contemplated.

In some embodiments, the conductive structures 138 are employed as access lines (e.g., local word lines) for the strings 160 of memory cells 162. In addition, the conductive structures 138 of one or more (e.g., from one to five) vertically lower tiers 134 (e.g., a vertically lowest tier 134) may be employed as select gate structures (e.g., select gate source (SGS) structures). Furthermore, the conductive structures 138 of one or more (e.g., from one to five) vertically upper tiers 134 (e.g., a vertically highest tier 134) may be employed as select gate structures (e.g., select gate drain (SGD) structures), as described in greater detail with reference to FIG. 1N. The conductive structures 138 may be formed of and include any conductive material including, but not limited to, n-doped polysilicon, p-doped polysilicon, undoped polysilicon, or a metal. In some embodiments, the conductive structures 138 comprise n-doped polysilicon. In other embodiments, the conductive structures 138 comprise W.

Intersections of the conductive structures 138 and the pillars 140 may form individual memory cells of the strings 160 of the memory cells 162. FIG. 1M illustrates an enlarged portion of box M of FIG. 1L and illustrates a memory cell 162, in accordance with embodiments of the disclosure. With reference to FIG. 1M, the memory cells 162 may each include the channel material 144, a tunnel dielectric material 142a (also referred to as a "tunneling dielectric material") of the cell material 142 (FIG. 1L) horizontally neighboring the channel material 144, a memory material 142b of the cell material 142 horizontally neighboring the tunnel dielectric material 142a, a dielectric blocking material 142c (also referred to as a "charge blocking material") of the cell material 142 horizontally neighboring the memory material 142b, and the conductive structures 138 horizontally neighboring the dielectric blocking material 142c. The channel material 144 may be horizontally interposed between the fill material 146 and the tunnel dielectric material 142a; the tunnel dielectric material 142a may be horizontally interposed between the channel material 144 and the memory material 142b; the memory material 142b may be horizontally interposed between the tunnel dielectric material 142a and the dielectric blocking material 142c; and the dielectric blocking material 142c may be horizontally interposed between the memory material 142b and a level of the conductive structures 138.

The tunnel dielectric material 142a may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 142a may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 142a comprises silicon dioxide. In other embodiments, the tunnel dielectric material 142a comprises silicon oxynitride.

The memory material 142b may comprise a charge trapping material or a conductive material. The memory material 142b may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 142b comprises silicon nitride.

The dielectric blocking material 142c may be formed of and include a dielectric material such as, for example, one or more of an oxide (e.g., silicon dioxide), a nitride (silicon nitride), and an oxynitride (silicon oxynitride), or another material. In some embodiments, the dielectric blocking material 142c comprises silicon oxynitride.

In some embodiments the tunnel dielectric material 142a, the memory material 142b, and the dielectric blocking material 142c together may comprise a structure configured to trap charge, such as, for example, an oxide-nitride-oxide (ONO) structure of the cell material 142 (FIG. 1L). In some such embodiments, the tunnel dielectric material 142a comprises silicon dioxide, the memory material 142b comprises silicon nitride, and the dielectric blocking material 142c comprises silicon dioxide.

In some embodiments, and as illustrated in FIG. 1M, a dielectric barrier material 148 may be formed directly neighboring the dielectric blocking material 142c and directly neighboring the insulative structures 130. A conductive liner material 150 may directly neighbor the dielectric barrier material 148 and the conductive structures 138, in some embodiments. For ease of illustration and understanding, the dielectric barrier material 148 and the conductive liner material 150 are not illustrated in FIG. 1L, but it will be understood that the electronic device 100 may include one or both of the dielectric barrier material 148 and the conductive liner material 150.

The conductive liner material 150, if present, may be formed of and include a seed material from which the conductive structures 138 may be formed. The conductive liner material 150 may be formed of and include, for example, a metal (e.g., titanium, tantalum), a metal nitride (e.g., tungsten nitride, titanium nitride, tantalum nitride), or another material. In some embodiments, the conductive liner material 150 comprises titanium nitride. In other embodiments, the dielectric barrier material 148 is in direct contact with each of the conductive structures 138 and the insulative structures 130 and the electronic device 100 is substantially (e.g., entirely) devoid of the conductive liner material 150 between the dielectric barrier material 148 and the conductive structures 138. In other words, each of the tiers 134 lack a titanium nitride material between the insulative structures 130 and the conductive structures 138, in some embodiments.

The dielectric barrier material 148 may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicate, zirconium silicate, lanthanum silicide, yttrium silicide, tantalum silicide), and a dielectric nitride (e.g., aluminum nitride, hafnium nitride, lanthanum nitride, yttrium nitride, tantalum nitride). In some embodiments, the dielectric barrier material 148 comprises aluminum oxide. In further embodiments, the memory cells 162 comprise so-called "floating gate" memory cells including floating gates (e.g., metallic floating gates) as charge storage structures. The floating gates may horizontally intervene between central structures of the pillars 140 and the conductive structures 138 of the tiers 134 of the stack 136.

With reference to FIG. 1N, one or more (e.g., from one to five) of the lowermost conductive structures 138, a lower select gate 138A, may be configured as select gate source(s) ("SGSs"). One or more (e.g., from one to five) of the uppermost conductive structures 138, upper select gates 138B, may be configured as select gate drain(s) ("SGDs"). The conductive structures 138 between the lower select gate 138A and the upper select gates 138B may be configured as access lines (e.g., word lines). There may be any suitable number of access lines in the stack 136, such as about 32, about 64, about 72, about 96, or about 128, for example, which are indicated schematically in FIG. 1N by the break line. In some embodiments, the source-level conductive structure 118 of the source tier 104 is separated from the lower select gate 138A of the conductive structures 138 by two or more dielectric materials (e.g., the third insulative material 128, the etch stop material 129, a lowermost one of the insulative structures 130 of the stack 136). In other embodiments, the source-level conductive structure 118 is separated from the lower select gate 138A by a single (e.g., one) dielectric material (e.g., the third insulative material 128). In additional embodiments, one or both of the materials (e.g., the second material 116b) of the source-level conductive structure 118 of the source tier 104 serves as the lower select gate 138A of the stack 136. In some such embodiments, the source-level conductive structure 118 may serve as the source of the sense device 120, as well as a select gate source (e.g., the lower select gate 138A) of the conductive structures 138 of the stack 136.

The electronic device 100 may further include at least one control unit 164 (e.g., control device) underlying the stack 136. For example, the control unit 164 may be positioned under the stack 136. The control unit 164 may include devices and circuitry for controlling various operations of other components of the electronic device 100. By way of non-limiting example, the control unit 164 may include one or more (e.g., each) of charge pumps (e.g., $V_{CCP}$ charge pumps, $V_{NEGWL}$ charge pumps, DVC2 charge pumps); delay-locked loop (DLL) circuitry (e.g., ring oscillators); drain supply voltage ($V_{dd}$) regulators; devices and circuitry for controlling column operations for arrays (e.g., arrays of vertical memory strings) to subsequently be formed within the electronic device 100, such as one or more (e.g., each) of decoders (e.g., column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices; and devices and circuitry for controlling row operations for arrays (e.g., arrays of the strings 160) within memory regions of the electronic device 100, such as one or more (e.g., each) of decoders (e.g., row decoders), drivers (e.g., word line (WL) drivers), repair circuitry (e.g., row repair circuitry), memory test devices, MUX, ECC devices, and self-refresh/wear leveling devices. In some embodiments, the control unit 164 includes CMOS (complementary metal-oxide-semiconductor) circuitry. In such embodiments, the control unit 164 may be characterized as having a "CMOS under Array" ("CuA") configuration.

As shown in FIG. 1N, the control unit 164 may include sense circuitry 168 (e.g., sense amplifiers) in electrical communication with the source-level conductive lines 108 of the source tier 104. Lower conductive contacts 166 may electrically connect the source-level conductive lines 108 of the source tier 104 and the sense circuitry 168 of the control unit 164. For example, the lower conductive contacts 166 may extend through a portion of the insulative materials 106 and through the base material 102, if present, to provide electrical connection between the source-level conductive lines 108 and the sense circuitry 168, although other configurations of connections therebetween may be contemplated. Conductive contacts having a differing configuration may extend, for example, above the upper surface of the source-level conductive lines 108 before extending through the insulative materials 106 to the control unit 164.

Following formation of the stack 136, one or more additional insulative materials, collectively referred to as upper insulative materials 152, may be formed adjacent to (e.g., on or over) upper surfaces of the stack 136 and the pillars 140, including exposed upper surfaces of each of the cell material 142, the channel material 144, and the fill material 146. The upper insulative materials 152 may be formed of and include, for example, at least one dielectric material, such as at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$). In some embodiments, the upper insulative materials 152 are formed of and include $SiO_2$. The upper insulative materials 152 may or may not include substantially the same material composition as the insulative materials 106.

Conductive plugs 154 (e.g., drain contact plugs) may be formed within openings in the upper insulative materials 152. In some embodiments, the conductive plugs 154 may extend through lower portions of the upper insulative materials 152 and are formed on or over the upper surfaces of the pillars 140, including each of the cell material 142, the channel material 144, and the fill material 146, as shown in FIG. 1N. In some such embodiments, upper surfaces of the cell material 142, the channel material 144, and the fill material 146 may be substantially coplanar with one another. Accordingly, a maximum lateral extent of the conductive plugs 154 (e.g., corresponding to the width $W_3$ (FIG. 1L) of the pillars 140) may be substantially equal to a maximum lateral extent of the cell material 142 with outer side surfaces of the conductive plugs 154 and the dielectric blocking material 142c (FIG. 1M) of the cell material 142 being substantially coplanar with one another.

In other embodiments, portions of each of the channel material 144 and the fill material 146 may be selectively removed, such as by etching, to recess the channel material 144 and the fill material 146 within the pillar openings prior to forming the conductive plugs 154. Uppermost surfaces of remaining portions of each of the channel material 144 and the fill material 146 within the pillar openings may be below (e.g., vertically recessed from) an uppermost surface of the stack 136 and may be below upper surfaces of the materials of the cell material 142. In other words, portions of the conductive plugs 154 may vertically overlie and be in direct physical contact with upper surfaces of the remaining portions of each of the channel material 144 and the fill material 146 while being adjacent to, inside, and in direct physical contact with a sidewall of the tunnel dielectric material 142a (FIG. 1M) of the cell material 142. In other words, portions of the conductive plugs 154 may be laterally adjacent to each of the tunnel dielectric material 142a, the memory material 142b (FIG. 1M), and the dielectric blocking material 142c (FIG. 1M) of the cell material 142. Accordingly, a maximum lateral extent of the conductive plugs 154 (e.g., corresponding to the width $W_4$ (FIG. 1L) the channel material 144 of the pillars 140) may be substantially equal to a maximum lateral extent of the channel material 144 with outer side surfaces of the conductive plugs 154 and the channel material 144 being substantially coplanar with one another.

The conductive plugs 154 may be formed of and include at least one conductive material. In some embodiments, the conductive plugs 154 may comprise a semiconductor material, such as one or more of polysilicon, silicon germanium, and germanium. The conductive plugs 154 may be undoped, or may include at least one dopant, such as a p-type dopant or an n-type dopant. In other embodiments, the conductive plugs 154 are formed of and include W. The process for forming the conductive plugs 154 may be, for example, CVD or ALD. The conductive plugs 154 may be adjacent (e.g., electrically coupled) to the channel material 144 of the pillars 140.

Conductive contacts 156 (e.g., contacts, upper bit line contacts) may be formed within additional openings in the upper insulative materials 152. The conductive contacts 156 may extend through additional portions of the upper insulative materials 152 and may be formed on or over upper surfaces of the conductive plugs 154. The conductive contacts 156 may be formed of and include at least one conductive material. In some embodiments, the conductive contacts 156 are formed of and include W. Outer side surfaces (e.g., sidewalls) of the conductive contacts 156 may exhibit a tapered profile with an upper portion of individual conductive contacts 156 having a greater critical dimension (e.g., width) than a lower portion thereof, as shown in FIG. 1N. In other embodiments, the conductive contacts 156 have a different profile, for example, a substantially rectangular profile, a dish-shaped profile, or any other three-dimensional shape.

Conductive lines 158 (e.g., upper data lines, upper bit lines) may be formed on or over upper surfaces of the conductive contacts 156. Interconnect structures (e.g., contact vias, bit line vias (not shown)) may be formed on or over the upper surfaces of the conductive contacts 156 and intervene between the conductive contacts 156 and the conductive lines 158 in some embodiments. The conductive lines 158 may be formed of and include at least one electrically conductive material, such as one or more of a metal, an alloy, a conductive metal oxide, a conductive metal nitride, a conductive metal silicide, and a conductively doped semiconductor material. In some embodiments, the conductive lines 158 are formed of doped polysilicon. In other embodiments, the conductive lines 158 are formed of tungsten silicide. The conductive lines 158 may or may not include substantially the same material composition as the source-level conductive lines 108. The conductive lines 158 may be electrically connected to the pillars 140 through the conductive plugs 154 and the conductive contacts 156.

The conductive lines 158 may be formed using one or more conventional deposition processes, such as one or more of a conventional ALD process, a conventional CVD process, and a conventional PVD process. In some embodiments, portions of the upper insulative materials 152 overlying the stack 136 are removed (e.g., through a conventional photolithographic patterning and etching process) to form openings overlying the conductive contacts 156; a conductive material is deposited into the openings; and excess portions of the conductive material are removed (e.g., through a CMP process) to form the conductive lines 158. Each of the conductive lines 158 may be at least partially (e.g., substantially) horizontally aligned in a first horizontal direction (e.g., the X-direction). As with the source-level conductive lines 108 of the source tier 104, elongated portions of the conductive lines 158 extend in a second horizontal direction (e.g., the Y-direction) substantially orthogonal to each of the first horizontal direction and a vertical direction (e.g., the Z-direction). In other words, the conductive lines 158 may laterally extend substantially orthogonal to the conductive structures 138 of the stack 136 and substantially parallel to the source-level conductive lines 108. In some embodiments, one or both (e.g., each) lateral side surface of the conductive lines 158 is in vertical alignment with respective lateral side surfaces of the source-level conductive lines 108. In other words, the conductive lines 158 overlying the stack 136 may be substantially vertically aligned with the source-level conductive lines 108 underlying the stack 136. As shown in FIG. 1N, the pillars 140 of the stack 136 may be isolated from the source-level conductive lines 108 of the source tier 104 without being in contact (e.g., direct electrical contact, direct physical contact) therewith. In other words, the sense device 120 vertically intervenes between the individual pillars 140 of the stack 136 and the source-level conductive lines 108 of the source tier 104.

Once formed, the channel material 144 of the pillars 140, in combination with the gate material 126 of the sense device 120, may form an extended gate region 170 (e.g., a gate) of the sense device 120. In other words, the individual strings 160 of the memory cells 162 serve as a gate of a respective one of the sense devices 120. Providing the sense device 120 of the source tier 104 and utilizing the extended gate region 170 as the gate of the sense device 120 may facilitate the reduced (e.g., relaxed) string current requirement needed to effectively operate all of the memory cells 162 in the individual strings 160 during operations of the electronic device 100 (e.g., a memory device). By using the individual strings 160 (e.g., NAND strings) as a gate for the sense device 120, for example, a string current requirement may be substantially changed (e.g., substantially reduced) and degradation of the string current may be substantially minimized (e.g., substantially eliminated). Accordingly, formation of the sense devices 120 utilizing the extended gate region 170 as the gate thereof may provide, at least in part, a substantially different (e.g., substantially reduced) string current requirement for the individual strings 160 of the memory cells 162.

In some embodiments, the string current of the individual strings 160 may depend, at least in part, on a number of electrons utilized to charge the respective gate (e.g., a charge capacitor) of individual memory cells of the strings 160 of the memory cells 162 at each respective tier 134 of the stack 136. For example, a string current requirement of a conventional electronic device may be within a range of from about 10 nanoamps (nA) to about 30 nA, such as within a range from about 10 nA to about 20 nA. By way of non-limiting example, a string current requirement of the electronic device 100 may be within a range of from about 0.5 nA to about 2.0 nA, such as within a range of from about 0.5 nA to about 0.8 nA, from about 0.8 nA to about 1.0 nA, from about 1.0 nA to about 1.5 nA, or from about 1.5 nA to about 2.0 nA. In some embodiments, the string current requirement may be less than or equal to about 1 nA. Accordingly, a reduction in the string current requirement may be between about 3 and 15 times, such as about 10 times (e.g., an order of magnitude), less than the string current requirement of a conventional electronic device not including the sense device 120 of the source tier 104.

During operation of the electronic device 100, electrical current may be applied to the conductive lines 158 (e.g., data lines), establishing a flow of electrical current (e.g., string current) through a portion of the channel material 144 of the pillars 140 and the gate material 126 of the sense device 120. As described above, a threshold voltage ($V_{TH}$) of the sense device 120 may depend, at least in part, on properties (e.g., concentration) of the at least one dopant of the channel material 122 of the sense device 120. Furthermore, a bias of the gate (e.g., the extended gate region 170) of the sense device 120 may depend, at least in part, on a $V_{TH}$ of the individual memory cells of the strings 160 of the memory cells 162. Without being bound to any theory, it is believed that as the current flows from the conductive lines 158 to one or both (e.g., each) of the channel material 144 and the gate material 126, current may be established along the extended gate region 170 thereof.

Individual memory cells of the strings 160 of the memory cells 162 may be accessed by biasing the conductive structures 138 (e.g., access lines) and the conductive lines 158 as appropriate for various memory operations (e.g., read, write, erase, etc.), as will be apparent to those of ordinary skill in the art. A specific memory cell 162 corresponding to a specific one of the conductive structures 138 may be accessed by biasing the others of the conductive structures 138 to cause the channel material 144 of the pillars 140 to be electrically conductive proximal to the others of the conductive structures 138. Prior to performing sensing (e.g., read) operations, various data handling (e.g., data conditioning) operations may be performed. For example, the gate (e.g., the extended gate region 170) of the sense device 120 may be "conditioned" to a preconditioned state at the beginning of a sense operation. The conditioning operation may include biasing the individual conductive structures 138 of all of the memory cells 162 to a maximum voltage and biasing the conductive line 158 to ground to achieve a voltage (e.g., about 0V) of an initial bias of the gate of each of the sense devices 120. Selected conductive structures 138 may be raised to a read-level voltage and the respective conductive line 158 may be raised to a selected voltage (e.g., about 1V). Such operations may be used to enhance the efficiency and reliability of the electronic device 100.

As the electrical current flows through the gate of an erased cell, as illustrated by dashed line 172, the $V_{TH}$ of individual memory cells of the strings 160 of the memory cells 162 may determine whether the bias is transferred to the gate material 126 of the sense device 120. In other words, the selected voltage (e.g., about 1V) may be transferred to the sense device 120 of a first string 160 of the memory cells 162, as shown in the first sense device 120 of the erased cell on the left-hand side of FIG. 1N. For the erased cell, the source-level conductive structure 118 (e.g., the second material 116b) may serve as a source region, as illustrated by dashed line 176, when a bias is applied between the source and the source-level conductive lines 108 serving as a drain region. In contrast, electrical current may not flow through a programmed cell of a neighboring sense device 120, as shown in the second sense device 120 on the right-hand side of FIG. 1N. As illustrated by dashed line 174, the electrical current may not flow through the gate of the neighboring sense device 120 of the programmed cell, as determined by the $V_{TH}$ of the individual memory cells of the strings 160 of the memory cells 162. Accordingly, the sense device 120 of a second string 160 of the memory cells 162 would remain at the preconditioned state of about 0V, for example. Since electrical current does not flow through the second string 160 of the memory cells 162 of the programmed cell, the second string 160 effectively electrically isolates the respective conductive line 158 from the sense device 120 and the extended gate region 170 may not be established for a programmed cell.

Thus, the string current requirement may be reduced due, at least in part, to the combined materials of the channel material 144 and the gate material 126 serving as the extended gate region 170 of the sense device 120 of an erased cell. Accordingly, associating (e.g., aligning) one of the sense devices 120 with the individual strings 160 of the memory cells 162 may allow a reduced string current requirement compared to that of conventional electronic devices, without decreasing the electrical current supplied to individual memory cells of the strings 160 of the memory cells 162. The reduced string current requirement may, in turn, provide reduced read/disturb errors as a result of the lower bias. Such a configuration may substantially prevent the risk of undesirable current leakage and short circuits of conductive structures (e.g., select gates) during use and operation of the electronic device 100 without significantly affecting conductivity. In addition, providing materials of the sense device 120 (e.g., the channel material 122, the gate material 126) fabricated using advanced crystallization techniques, for example, may allow increased uniformity of the $V_{TH}$ of the sense device 120 during use and operation of the electronic device 100. Such processes utilized to form the materials of the sense device 120 may at least partially depend on material properties, and may affect the number (e.g., density) of defects present in the materials.

Thus, in accordance with embodiments of the disclosure an electronic device comprises a stack comprising tiers of alternating conductive structures and insulative structures overlying a source tier, a pillar comprising a channel material extending vertically through the stack, and a sense device comprising a gate material within the source tier. The gate material of the sense devices is in electrical communication with the channel material of the pillar.

Thus in accordance with further embodiments of the disclosure, a method of forming an electronic device comprises forming a sense device comprising a gate material within a source tier, forming a stack comprising vertically alternating insulative structures and additional insulative structures over the source tier, and forming a pillar comprising a channel material and at least one dielectric material extending vertically through the stack. The channel material of the pillar in electrical communication with the gate material of the sense device. The method comprises removing the additional insulative structures, and forming a conductive material between vertically neighboring insulative structures.

Figure 2:
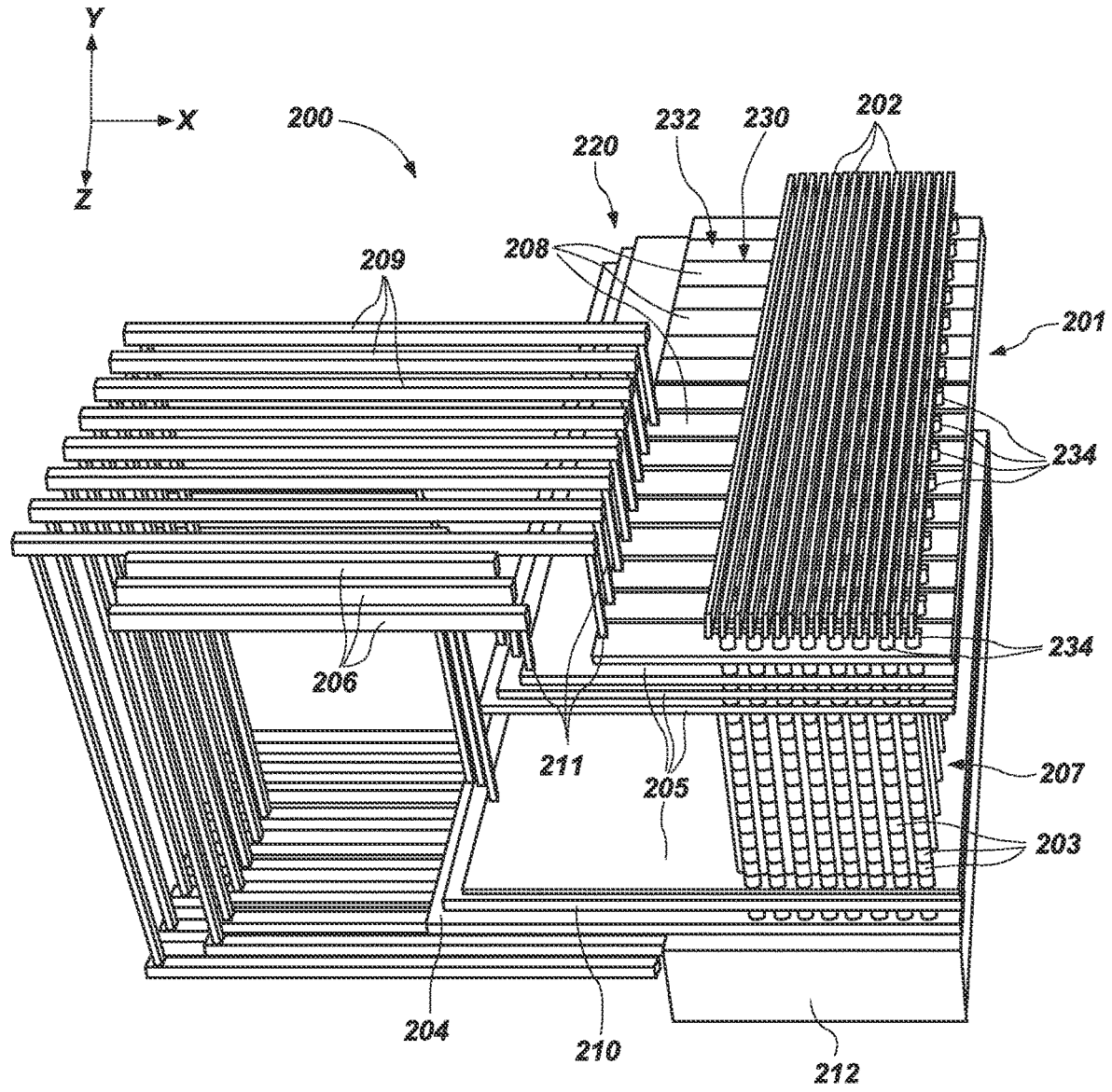
FIG. 2 is a partial cutaway perspective view of an electronic device, in accordance with embodiments of the disclosure.

FIG. 2 illustrates a partial cutaway perspective view of a portion of an electronic device 200 (e.g., a microelectronic device, a memory device, such as a 3D NAND Flash memory device) including one or more electronic device structures 201 (e.g., a microelectronic device structure). The electronic device 200 may be substantially similar to the electronic device 100 previously described with reference to FIGS. 1A through 1N. As shown in FIG. 2, the electronic device structure 201 of the electronic device 200 may include a staircase structure 220 defining contact regions for connecting interconnect lines 206 to conductive structures 205 (e.g., corresponding to the conductive structures 138

(FIG. 1N)). The electronic device structure 201 may include vertical strings 207 (e.g., corresponding to the strings 160 (FIG. 1L)) of memory cells 203 (e.g., corresponding to the memory cells 162 (FIG. 1L)) that are coupled to each other in series. The vertical strings 207 may extend vertically (e.g., in the Z-direction) and orthogonally to conductive lines and the conductive structures 205, such as data lines 202 (e.g., corresponding to the conductive lines 158 (FIG. 1N)), a source tier 204 (e.g., corresponding to the source tier 104 including the sense device 120 (FIG. 1N)), the conductive structures 205, the interconnect lines 206, first select gates 208 (e.g., upper select gates, drain select gates (SGDs), such as the upper select gates 138B (FIG. 1N) of the stack 136 (FIG. 1N)), select lines 209, and a second select gate 210 (e.g., a lower select gate, a source select gate (SGS), such as the lower select gate 138A (FIG. 1N)). The select gates 208 may be horizontally divided (e.g., in the Y-direction) into multiple blocks 232 horizontally separated (e.g., in the Y-direction) from one another by slots 230 formed within replacement gate slots and dielectric materials of additional slots.

Vertical conductive contacts 211 may electrically couple components to each other as shown. For example, the select lines 209 may be electrically coupled to the first select gates 208 and the interconnect lines 206 may be electrically coupled to the conductive structures 205. The electronic device 200 may also include a control unit 212 (e.g., corresponding to the control unit 164 (FIG. 1N)) positioned under the memory array, which may include at least one of string driver circuitry, pass gates, circuitry for selecting gates, circuitry for selecting conductive lines (e.g., the data lines 202, the interconnect lines 206), circuitry for amplifying signals, and circuitry for sensing signals (e.g., the sense circuitry 168 (FIG. 1N)). The control unit 212 may be electrically coupled to the data lines 202, the source tier 204, the interconnect lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., digit lines, bit lines) may extend horizontally in a second direction (e.g., in the Y-direction) that is at an angle (e.g., perpendicular) to the first direction in which the first select gates 208 extend. Individual data lines 202 may be coupled to individual groups of the vertical strings 207 extending in the second direction (e.g., the Y-direction) at the first end (e.g., the upper end) of the vertical strings 207 of the individual groups. Additional individual groups of the vertical strings 207 extending in the first direction (e.g., the X-direction) and coupled to individual first select gates 208 may share a particular vertical string 207 thereof with individual group of vertical strings 207 coupled to an individual data line 202. Thus, an individual vertical string 207 of memory cells 203 may be selected at an intersection of an individual first select gate 208 and an individual data line 202. Accordingly, the first select gates 208 may be used for selecting memory cells 203 of the vertical strings 207 of memory cells 203.

The conductive structures 205 (e.g., word lines) may extend in respective horizontal planes. The conductive structures 205 may be stacked vertically, such that each conductive structure 205 is coupled to at least some of the vertical strings 207 of memory cells 203, and the vertical strings 207 of the memory cells 203 extend vertically through the stack structure including the conductive structures 205. The conductive structures 205 may be coupled to or may form control gates of the memory cells 203.

The first select gates 208 and the second select gates 210 may operate to select a vertical string 207 of the memory cells 203 interposed between data lines 202 and the source tier 204. Thus, an individual memory cell 203 may be selected and electrically coupled to a data line 202 by operation of (e.g., by selecting) the appropriate first select gate 208, second select gate 210, and conductive structure 205 that are coupled to the particular memory cell 203.

The staircase structure 220 may be configured to provide electrical connection between the interconnect lines 206 and the conductive structures 205 through the vertical conductive contacts 211. In other words, an individual conductive structure 205 may be selected via an interconnect line 206 in electrical communication with a respective vertical conductive contact 211 in electrical communication with the conductive structure 205. The data lines 202 may be electrically coupled to the vertical strings 207 through conductive contact structures 234 (e.g., the conductive contacts 156 (FIG. 1N)).

Thus, in accordance with embodiments of the disclosure, a memory device comprises vertically extending strings of memory cells, access lines in electrical communication with the vertically extending strings of memory cells and extending in a first horizontal direction, upper data lines in electrical communication with the vertically extending strings of memory cells and extending in a second horizontal direction, substantially transverse to the first horizontal direction, lower data lines extending in the second horizontal direction, and sense devices vertically interposed between and in electrical communication with the vertically extending strings of memory cells and the lower data lines. Individual strings of the vertically extending strings of memory cells are configured as a gate of a respective one of the sense devices.

Figure 3:
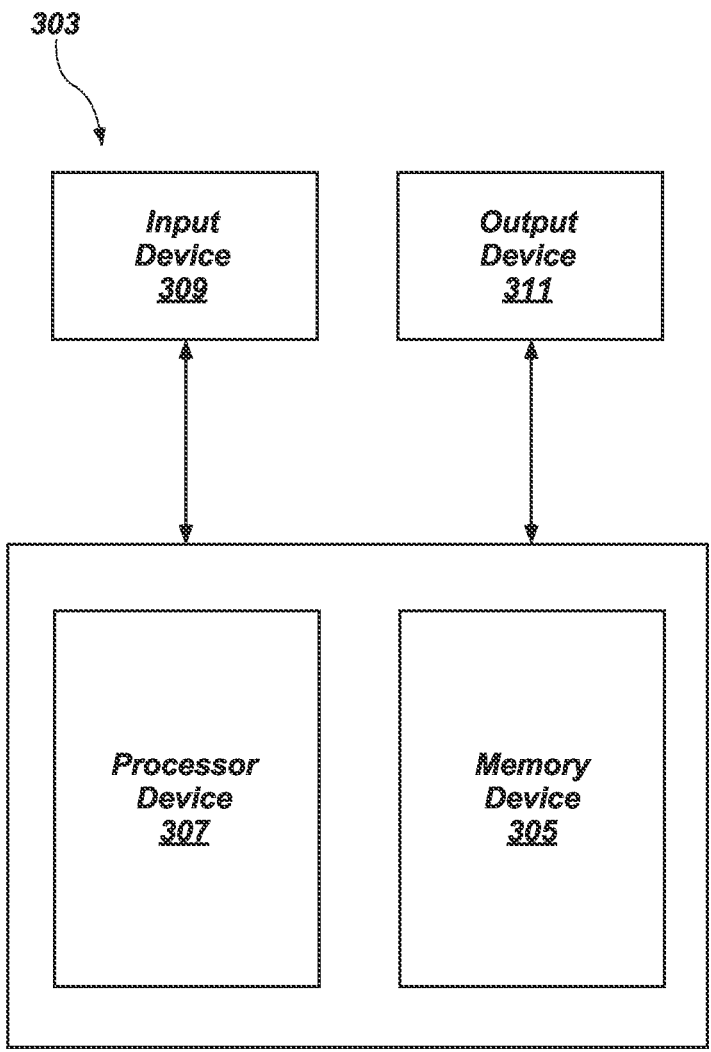
FIG. 3 is a block diagram of an electronic system, in accordance with embodiments of the disclosure.

Electronic devices (e.g., the electronic devices 100, 200) including the sense device 120 of the source tier 104, according to embodiments of the disclosure, may be used in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of an electronic device (e.g., the electronic devices 100, 200 previously described with reference to FIGS. 1A through 1N and FIG. 2) including the sense device 120 of the source tier 104.

The electronic system 303 may further include at least one electronic signal processor device 307 (often referred to as a "microprocessor"). The electronic signal processor device 307 may optionally include an embodiment of an electronic device (e.g., one or more of the electronic devices 100, 200 previously described with reference to FIGS. 1A through 1N and FIG. 2). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
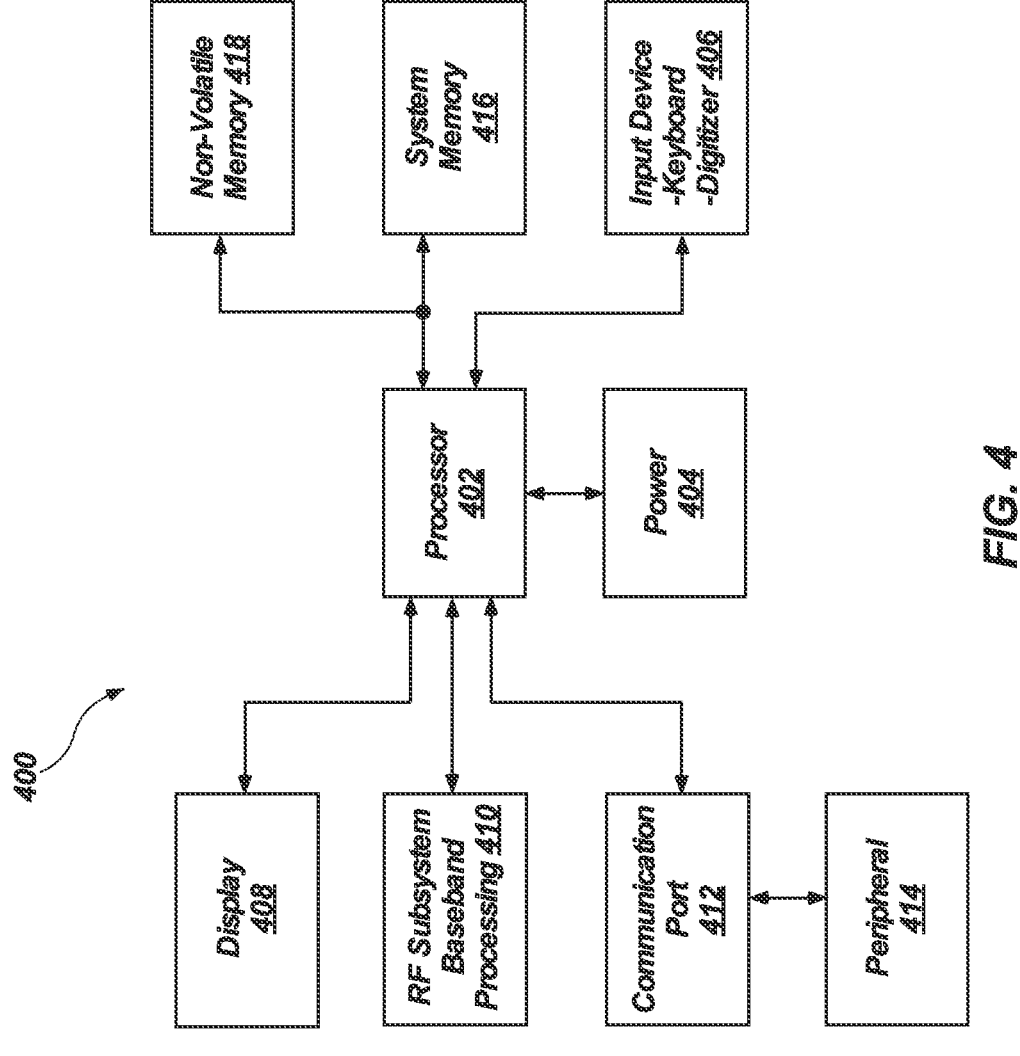
FIG. 4 is a block diagram of a processor-based system, in accordance with embodiments of the disclosure.

With reference to FIG. 4, depicted is a processor-based system 400. The processor-based system 400 may include various electronic devices (e.g., the electronic devices 100, 200) manufactured in accordance with embodiments of the present disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include electronic devices (e.g., the electronic devices 100, 200) manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the electronic devices (e.g., the electronic devices 100, 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include electronic devices, such as the electronic devices (e.g., the electronic devices 100, 200) described above, or a combination thereof.

Thus, in accordance with embodiments of the disclosure a system comprises a processor operably coupled to an input device and an output device, and a memory device operably coupled to the processor. The memory device comprises strings of memory cells extending vertically through a stack of alternating dielectric materials and conductive materials, and source-level sense devices underlying at least some of the strings of memory cells. The source-level sense devices are in electrical communication with a source region overlying a drain region and individually comprise a gate region in vertical alignment with individual strings of memory cells.

The electronic devices and systems of the disclosure advantageously facilitate one or more of improved simplicity, greater packaging density, and increased miniaturization of components as compared to conventional devices and conventional systems. The methods of the disclosure facilitate the formation of devices (e.g., apparatuses, microelectronic devices, memory devices) and systems (e.g., electronic systems) having one or more of improved performance, reliability, and durability, lower costs, increased yield, increased miniaturization of components, improved pattern quality, and greater packaging density as compared to conventional devices (e.g., conventional apparatuses, conventional electronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
a stack comprising tiers of alternating conductive structures and insulative structures overlying a source tier;
a pillar comprising a channel material extending vertically through the stack; and
a source-level sense device within the source tier, the source-level sense device comprising:
a gate material within the source tier, the gate material of the source-level sense device in electrical communication with the channel material of the pillar;
a gate dielectric material in contact with the gate material and substantially surrounding the gate material; and
a source device channel material in contact with the gate dielectric material and substantially surrounding the gate dielectric material; and
the source tier, comprising:
a source-level conductive structure around the source-level sense device;
a lower conductive plug in contact with the source device channel material; and
a source-level conductive line in contact with the lower conductive plug.

2. The electronic device of claim 1, wherein the source-level sense device is associated with a single pillar of the stack.

3. The electronic device of claim 1, wherein the gate material of the source-level sense device is vertically aligned and in direct physical contact with the channel material of the pillar, a width between opposing sidewalls of the channel material of the pillar exhibiting a substantially U-shaped configuration is relatively less than a width of the gate material.

4. The electronic device of claim 1, wherein the source-level conductive line is orthogonal to a direction of the conductive structures of the stack, the source tier comprises a source material configured as a source region of the source-level sense device, and the source-level conductive line is configured as a drain region of the source-level sense device.

5. The electronic device of claim 4, further comprising digit lines overlying the pillar and extending substantially parallel to a direction of the source-level conductive line of the source tier.

6. The electronic device of claim 4, wherein an upper portion of the gate material of the source-level sense device is laterally adjacent to one or more materials of the source material of the source tier.

7. The electronic device of claim 1, wherein the channel material of the pillar, in combination with the gate material of the source-level sense device comprises an extended gate region of the source-level sense device.

8. The electronic device of claim 1, wherein the source-level sense device comprises the channel material of the pillar isolated from the source device channel material of the source-level sense device by one or more of the gate dielectric material of the source-level sense device and a cell material of the pillar.

9. The electronic device of claim 8, wherein one or both of the gate material and the source device channel material comprises a substantially monolithic structure comprising a crystalline material.

10. A method of forming an electronic device, the method comprising:
forming a source-level sense device within a source tier, the source-level sense device comprising:
a gate material within the source tier,
a gate dielectric material in contact with the gate material and substantially surrounding the gate material, and
a source device channel material in contact with the gate dielectric material and substantially surrounding the gate dielectric material;
the source tier, comprising:
a source-level conductive structure around the source-level sense device;
a lower conductive plug in contact with the source device channel material; and
a source-level conductive line in contact with the lower conductive plug;
forming a stack comprising tiers of alternating insulative structures and additional insulative structures over the source tier;
forming a pillar comprising a channel material and at least one dielectric material extending vertically through the stack, the channel material of the pillar in electrical communication with the gate material of the source-level sense device;
removing the additional insulative structures; and
forming a conductive material between vertically neighboring insulative structures and forming the stack comprising tiers of alternating conductive structures and the insulative structures overlying the source tier.

11. The method of claim 10, further comprising:
forming the source-level conductive line to extend through insulative materials of the source tier;
forming the source-level conductive structure including one or more of a tungsten material and a polysilicon material over the insulative materials;
forming openings through the source-level conductive structure and the insulative materials; and
forming the source-level sense device in a respective opening.

12. The method of claim 11, wherein forming the openings comprises staggering the openings such that a first row of aligned openings is offset from a second row of aligned openings immediately adjacent to the first row.

13. The method of claim 11, wherein forming the source-level conductive line comprises electrically connecting the source-level conductive line of the source tier to sense circuitry underlying the stack.

14. The method of claim 13, wherein forming the source-level sense device comprises:
conformally forming the source device channel material in the respective opening;
conformally forming the gate dielectric material over the source device channel material; and
forming the gate material over the gate dielectric material using a non-conformal deposition act.

15. The method of claim 14, further comprising forming a conductive plug structure adjacent the source-level sense device, the conductive plug structure including a first concentration of an n-type dopant and the source device channel material of the source-level sense device including a second concentration of an n-type dopant that is relatively lower than the first concentration.

16. The method of claim 10, wherein forming the pillar comprises providing a gate region of the source-level sense device using the channel material of the pillar in vertical alignment with the source-level sense device.

17. The method of claim 10, wherein forming the pillar comprises recessing a portion of an upper surface of the gate material of the source-level sense device and forming at least a portion of the channel material of the pillar within a recessed region of the gate material of the source-level sense device.

18. The method of claim 10, wherein forming the stack comprises forming one or more of a dielectric material and an etch stop material over the source tier prior to forming the alternating insulative structures and the additional insulative structures of the stack.

\* \* \* \* \*